(12) United States Patent
Xiong et al.

(10) Patent No.: US 12,414,276 B2
(45) Date of Patent: Sep. 9, 2025

(54) HEAT DISSIPATION ASSEMBLY, DISPLAY MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ren Xiong, Beijing (CN); Zhihui Wang, Beijing (CN); Lei Yang, Beijing (CN); Xuan Luo, Beijing (CN); Fengping Wu, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/246,941

(22) PCT Filed: Mar. 31, 2022

(86) PCT No.: PCT/CN2022/084489
§ 371 (c)(1),
(2) Date: Mar. 28, 2023

(87) PCT Pub. No.: WO2023/184377
PCT Pub. Date: Oct. 5, 2023

(65) Prior Publication Data
US 2024/0365521 A1    Oct. 31, 2024

(51) Int. Cl.
*H05K 7/20* (2006.01)
*G06F 1/16* (2006.01)

(52) U.S. Cl.
CPC ....... *H05K 7/20963* (2013.01); *G06F 1/1637* (2013.01)

(58) Field of Classification Search
None
See application file for complete search history.

(56) References Cited

U.S. PATENT DOCUMENTS

2019/0286192 A1    9/2019  Cao et al.
2021/0034121 A1*   2/2021  Lee .......................... G06F 1/203
(Continued)

FOREIGN PATENT DOCUMENTS

CN    107018471 A    8/2017
CN    111385390 A    7/2020
(Continued)

*Primary Examiner* — Mukundbhai G Patel
(74) *Attorney, Agent, or Firm* — Dority & Manning, P.A.

(57) ABSTRACT

A heat dissipation assembly includes a heat dissipation layer main body including at least one first side, arc-shaped corner side and second side, at least one first bending portion, second bending portion and corner bending portion. A first side, an arc-shaped corner side and a second side are sequentially connected. A first bending portion, a corner bending portion and a second bending portion, that are sequentially connected, are respectively connected to the first side, the arc-shaped corner side and the second side; the corner bending portion is provided with at least one first opening therein. A first opening is in a shape of a strip, and extends substantially in a radial direction of the arc-shaped corner side. In a case where the corner bending portion is provided with first openings therein, the first openings are sequentially arranged at intervals in an extending direction of the arc-shaped corner side.

18 Claims, 17 Drawing Sheets

(56) References Cited

U.S. PATENT DOCUMENTS

| | | | | |
|---|---|---|---|---|
| 2021/0378107 A1* | 12/2021 | Hwang | ............. | H05K 7/20954 |
| 2022/0085305 A1 | 3/2022 | Zhao et al. | | |
| 2022/0308625 A1* | 9/2022 | Gao, Sr. | ................. | G09F 9/301 |
| 2023/0026482 A1 | 1/2023 | Wang et al. | | |
| 2023/0115315 A1 | 4/2023 | Han et al. | | |

FOREIGN PATENT DOCUMENTS

| | | | | | |
|---|---|---|---|---|---|
| CN | 112133202 | A | | 12/2020 | |
| CN | 112234152 | A | | 1/2021 | |
| CN | 112396971 | A | | 2/2021 | |
| CN | 112671955 | A | | 4/2021 | |
| CN | 112735279 | A | | 4/2021 | |
| CN | 114005364 | A | * | 2/2022 | ............. G09F 9/301 |
| WO | WO-2021249183 | A1 | * | 12/2021 | ........... G06F 1/1628 |

\* cited by examiner

HEAT DISSIPATION ASSEMBLY, DISPLAY MODULE AND DISPLAY DEVICE

CROSS-REFERENCE TO RELATED APPLICATION

The present application is a national phase entry under 35 USC 371 of International Patent Application No. PCT/CN2022/084489, filed on Mar. 31, 2022, which is incorporated herein by reference in its entirety.

TECHNICAL FIELD

The present disclosure relates to the field of display technologies, and in particular, to a heat dissipation assembly, a display module and a display device.

BACKGROUND

With the development of display technology, flexible screens are favored due to the characteristics of softness, and can be made into display devices with various shapes such as curved, folded, special-shaped, and curled. The curved display device means that at least one side of a display screen has a curved shape.

At present, as the attaching process of the flexible screen having two curved side (two sides of the display screen each have a curved shape) matures day by day, the attaching process of the flexible screen having four curved sides (four sides of the display screen each have a curved shape) also gradually begins to develop. In the display device having four curved sides, a curved part of the display screen, especially a curved part at the corner, is subjected to complex forces, so that a high requirement is needed for attaching of the display screen in the display device having four curved sides.

SUMMARY

In an aspect, a heat dissipation assembly is provided. The heat dissipation assembly includes a heat dissipation layer main body, at least one first bending portion, at least one second bending portion and at least one corner bending portion.

The heat dissipation layer main body includes at least one first side, at least one arc-shaped corner side and at least one second side. A first side, an arc-shaped corner side and a second side are sequentially connected, and extending directions of the first side and the second side intersect with each other. A first bending portion is connected to the first side; a first bending portion is connected to the first side; a corner bending portion is connected to the arc-shaped corner side, and the corner bending portion is provided with at least one first opening therein.

The first bending portion, the corner bending portion and the second bending portion are sequentially connected.

A first opening is in a shape of a strip, and the first opening extends substantially in a radial direction of the arc-shaped corner side. In a case where the corner bending portion is provided with a plurality of first openings therein, the plurality of first openings are sequentially arranged at intervals in an extending direction of the arc-shaped corner side.

In some embodiments, the first opening includes a first main body portion and two first end portions respectively disposed at two ends of the first main body portion. The first main body portion is in a shape of a strip, and the first main body portion extends substantially in the radial direction of the arc-shaped corner side. A width of an end, proximate to the arc-shaped corner side, of the first main body portion is smaller than or equal to a width of another end, away from the arc-shaped corner side, of the first main body portion.

In some embodiments, the two first end portions of the first opening are each in a shape of an arc.

In some embodiments, of the two first end portions of the first opening, a first end portion proximate to the arc-shaped corner side includes a first arc-shaped border curved toward the first main body portion, another first end portion away from the arc-shaped corner side includes a second arc-shaped border curved toward the first main body portion; a radius of curvature of the first arc-shaped border is less than or equal to a radius of curvature of the second arc-shaped border.

In some embodiments, the first main body portion includes a first border and a second border that are opposite to each other, and the first border and the second border each extend in the radial direction of the arc-shaped corner side; an included angle between the first border and the second border is in a range of 0° to 30°, inclusive.

In some embodiments, the corner bending portion is provided with the plurality of the first openings therein, lengths of the plurality of first openings are substantially equal.

In some embodiments, an orthogonal projection, on a reference surface, of an arc-shaped side of the corner bending portion away from the heat dissipation layer main body is closer to an orthogonal projection, on the reference surface, of the heat dissipation layer main body than a reference arc. The reference surface is parallel to the heat dissipation layer main body.

An orthogonal projection, on the reference plane, of a side of the first bending portion away from the heat dissipation layer main body is a first projection border; an orthogonal projection, on the reference plane, of a side of the second bending portion away from the heat dissipation layer main body is a second projection border; the reference arc is an arc tangent to the first projection border and the second projection border.

In some embodiments, in the radial direction of the arc-shaped corner side, a distance between the orthogonal projection, on the reference plane, of the arc-shaped side of the corner bending portion away from the heat dissipation layer main body and the reference arc is in a range of 1 mm to 2 mm, inclusive.

In some embodiments, the side of the first bending portion away from the heat dissipation layer main body and the side of the second bending portion away from the heat dissipation layer main body each have an arc-shaped transition with the arc-shaped side of the corner bending portion away from the heat dissipation layer main body.

In some embodiments, the first bending portion and/or the second bending portion is provided with at least one second opening therein.

In some embodiments, a second opening is in a shape of a strip, and the second opening extends substantially in an extending direction of a side, connected to the first bending portion or the second bending portion where the second opening is located, of the heat dissipation layer main body. In a case where the first bending portion and/or the second bending portion is provided with a plurality of second openings therein, the plurality of second openings are arranged in at least one row, second openings in each row are sequentially arranged at intervals in a first direction. In a case where the plurality of second openings are arranged in a plurality of rows, the plurality of rows of second openings are arranged in parallel in a second direction.

The first direction is the extending direction of the side, connected to the first bending portion or the second bending portion where the plurality of second openings are located, of the heat dissipation layer main body, and the second direction intersects the first direction.

In some embodiments, a second opening includes a second main body portion and two second end portions respectively disposed at two ends of the second main body portion; the second main body portion is in a shape of a strip, and extends in an extending direction of a side, connected to the first bending portion or the second bending portion where the second opening is located, of the heat dissipation layer main body.

In a length extending direction of the second main body portion, widths the second main body portion at multiple positions are substantially equal; alternatively, in the length extending direction of the second main body portion, the width of the second main body portion is gradually decreased and then gradually increased from a second end portion of the two second end portions of the second opening to another second end portion of the two second end portions.

In some embodiments, the corner bending portion is provided with the plurality of first openings therein, and the first bending portion and/or the second bending portion is provided with a plurality of second openings therein, a transition region is provided between a region where the plurality of first openings are located and a region where the plurality of second openings are located; a width of the transition region is approximately in a range of 1 mm to 2.5 mm, inclusive; the transition region is provided with no opening.

In some embodiments, the heat dissipation assembly further includes a transition portion. The transition portion is arranged in the transition region, the transition portion is connected to the first bending portion and the second bending portion.

The transition portion includes an arc-shaped transition side, and the arc-shaped transition side is curved toward a direction in which the transition portion is away from the heat dissipation layer main body portion. A side of the first bending portion away from the heat dissipation layer main body and a side of the second bending portion away from the heat dissipation layer main body are each connected to an arc-shaped side of the corner bending portion away from the heat dissipation layer main body by the arc-shaped transition side.

In some embodiments, second openings, located at a position proximate to a border of the transition region, are aligned.

In some embodiments, the heat dissipation layer main body includes two first sides disposed opposite to each other, four arc-shaped corner sides, and two second sides disposed opposite to each other; a single arc-shaped corner side is connected between any adjacent first side and second side.

The heat dissipation assembly comprises first bending portions, second bending portions and corner bending portions. Each first side is connected to a single first bending portion, each second side is connected to a single second bending portion, and each arc-shaped corner side is connected to a single corner bending portion; each corner bending portion is provided with the at least one first opening.

In some embodiments, the heat dissipation assembly includes a heat dissipation layer, an adhesive layer, and a buffer layer.

The heat dissipation layer main body, the at least one first bending portion, the at least one second bending portion and the at least one corner bending portion are located in the heat dissipation layer. The adhesive layer is arranged on a side of the heat dissipation layer. The buffer layer is arranged between the adhesive layer and the heat dissipation layer.

In some embodiments, a thickness of the heat dissipation layer is greater than or equal to 100 μm.

In some embodiments, the heat dissipation layer includes a copper plate, an aluminum alloy plate, or a stainless steel plate.

In another aspect, a display module is provided. The display module includes a display panel and the heat dissipation assembly as described in any one of the above embodiments.

The display panel includes a light exit surface and a backlight surface; edges at sides and edges at corners of the display panel are bent toward the backlight surface. The heat dissipation assembly is disposed on the backlight surface of the display panel, and the at least one first bending portion, the at least one second bending portion and the at least one corner bending portion of the heat dissipation assembly are curved toward a direction away from the display panel.

In yet another aspect, a display device is provided. The display device includes the heat dissipation assembly as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
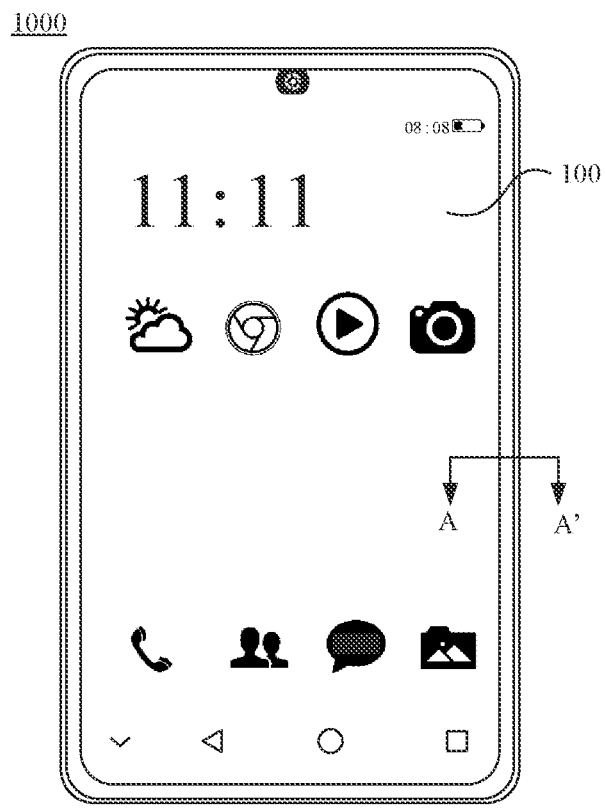
FIG. 1 is a top view of a display device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "electrically connected" and "connected" and derivatives thereof may be used. For example, the term "electrically connected" may be used in the description of some embodiments to indicate that two or more components are in direct physical contact or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

In the description of the present disclosure, it will be understood that orientations or positional relationships indicated by terms "center", "longitudinal", "transverse", "length", "width", "vertical", "horizontal", "inner", "outer" are based on orientations or positional relationships shown in the drawings, which merely to facilitate and simplify the description of the present disclosure, but not to indicate or imply that the referred devices or elements must have a particular orientation, or must be constructed or operated in a particular orientation. Therefore, these terms should not be construed as limitations to the present disclosure.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

FIG. 1 is a top view of a display device 1000 provided by some embodiments of the present disclosure. The display device 1000 may be any device that displays images whether in motion (e.g., a video) or stationary (e.g., a still image), and regardless of text or image. More specifically, it is contemplated that the embodiments may be implemented in or associated with a plurality of electronic devices. The plurality of electronic devices may include (but not limit to), for example, mobile telephones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat panel displays, computer monitors, car displays (e.g., odometer displays), navigators, cockpit controllers and/or displays, camera view displays (e.g., rear view camera displays in vehicles), electronic photos, electronic billboards or signages, projectors, building structures, packagings and aesthetic structures (e.g., a display for an image of a piece of jewelry). FIG. 1 is illustrated by taking an example in which the display device 1000 is a mobile phone.

The display device 1000 may be a curved display device.

Figure 2:
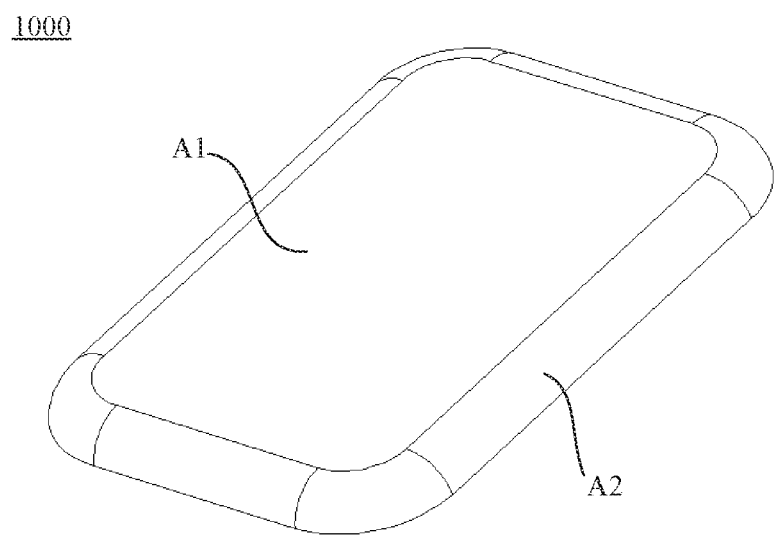
FIG. 2 is a structural diagram of a display device, in accordance with some embodiments.
Figure 3:
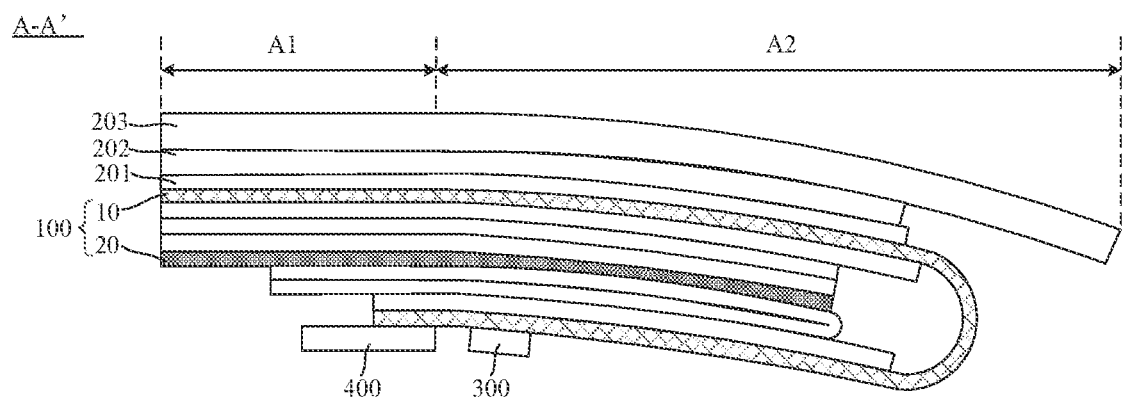
FIG. 3 is a sectional view taken along the section line A-A' in FIG. 1.

As shown in FIGS. 2 and 3, the display device 1000 includes a main body region A1 and a curved display region A2, and a portion, that is bent, of the display device 1000 is in the curved display region A2.

As shown in FIG. 2, the display device 1000 may be a display device having curved surfaces all around, and the curved display region A2 is arranged around the main display region A1.

For example, a border of the display device 1000 is substantially in a shape of a rectangle. It will be noted that, the term "substantially in a shape of a rectangle" means that the border of the display device 1000 is in a shape of a rectangle as a whole, but is not limited to a standard rectangle. That is, "rectangle" herein includes not only a standard rectangle but also a shape similar to a rectangle in consideration of process conditions. For example, the long and short sides of the rectangle are curved at each intersecting position (i.e., corners), that is, the corners are smooth, so that the border of the display device 1000 is in a shape of a rounded rectangle in a plan view.

As shown in FIG. 3, the display device 1000 includes a display module 100.

In some embodiments, the display device 1000 further includes a polarizer 201, an adhesive layer 202 and a cover plate 203 that are disposed on a light exit surface of the display module 100.

The polarizer 201 is disposed on the light exit surface of the display panel 100, and corresponds to at least the main body region A1, and the polarizer 201 may reduce a light reflectivity of the light exit surface of the display module 100, and improve a display contrast of the display device 1000.

The cover plate 203 is disposed on a side of the polarizer 201 away from the display module 100, so as to protect the display module 100.

The adhesive layer 202 is disposed between the polarizer 201 and the cover plate 203, so as to adhere the polarizer 201 to the cover plate 203.

In some embodiments, referring to FIG. 3, the display device 1000 further includes a display driver chip 300 and a flexible circuit board 400.

The display driver chip 300 is electrically connected to the display module 100, and the flexible circuit board 400 is electrically connected to the display module 100. The display driver chip 300 and the flexible circuit board 400 are used to provide the display module 100 with data signals required for displaying images.

For example, the display device 1000 may further include a housing. The housing has a high hardness, and can protect the electronic devices, the flexible material, and other components of the display device 1000 from external damage.

Figure 4:
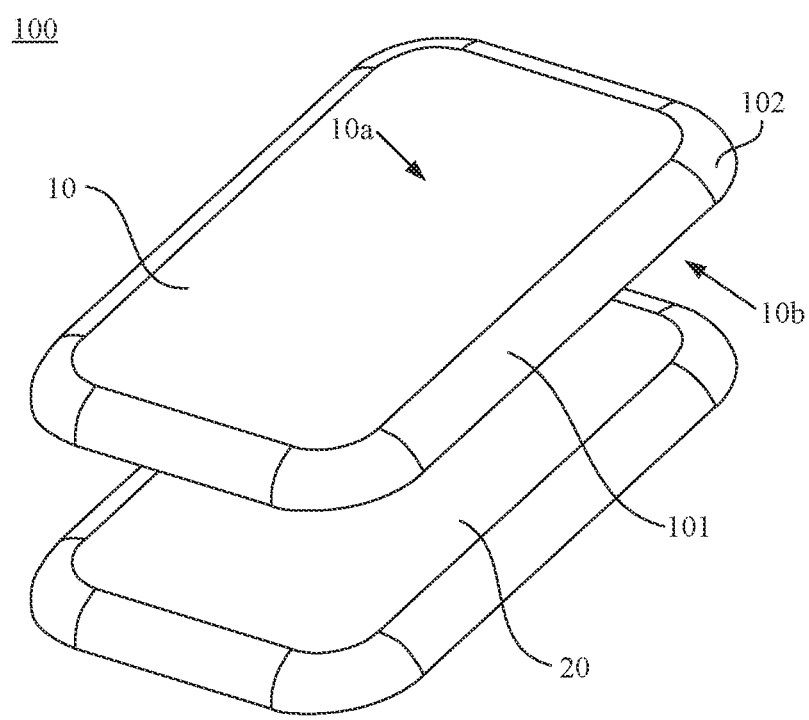
FIG. 4 is a structural diagram of a display module, in accordance with some embodiments.

As shown in FIGS. 3 and 4, the display module 100 includes a display panel 10 and a heat dissipation assembly 20.

The display panel 10 may be an electroluminescent display panel or a photoluminescent display panel. In a case where the display panel 10 is the electroluminescent display panel, the electroluminescent display panel may be an organic light-emitting diode (OLED) display panel or a quantum dot light-emitting diode (QLED) display panel. In a case where the display panel 10 is the photoluminescent display panel, the photoluminescent display panel may be a quantum dot photoluminescent display panel.

Referring to FIG. 4, the display panel 10 includes a light exit surface 10a and a backlight surface 10b. The light exit surface 10a refers to a surface of the display panel 10 for displaying images, and the backlight surface 10b refers to a surface of the display panel 10 away from the light exit surface 10a.

Referring to FIG. 4, edges 101 at sides and edges 102 at corners of the display panel 10 are bent toward the backlight surface 10b.

For example, referring to FIG. 4, the edges at four sides of the display panel 10 are each bent toward the backlight surface 10b, and the edges at four corners are also each bent toward the backlight surface 10b.

Referring to FIG. 4, the heat dissipation assembly 20 is disposed on the backlight surface 10b of the display panel 10.

For example, the display panel 10 includes pixel circuits and side signal lines partially disposed in the curved display region A2, and an orthogonal projection of the heat dissipation assembly 20 on the display panel 10 overlaps with the pixel circuits and the side signal lines to dissipate heat therefrom.

The heat dissipation assembly 20 is arranged on a side of the display panel 10 away from the light exit surface, and the heat dissipation assembly 20 is configured to dissipate heat of the display device 1000, so as to prevent the temperature inside the display device 1000 from rising and affecting normal operation of all electronic components inside the display device 1000, thereby ensuring a display effect of the display device 1000. Moreover, it is possible to avoid the damage of high-temperature environment to all the electronic components, and thus prolong the service life of all the electronic components.

The inventor of the present disclosure have found through research that, in the related art, in an attaching process of the flexible screen having four curved edges (the process in which the heat dissipation assembly is bent and attached to the display panel after four edges of the display panel are all bent), the heat dissipation assembly is subjected to a large tensile and compressive stress, and particularly, in a display device with four curved sides at a large angle (e.g., 88°), the heat dissipation assembly is prone to wrinkle or crack due to stress concentration at the corners, which results in a poorly attaching of the heat dissipation assembly, and affects the heat dissipation effect.

It will be noted that, the term "corner" refers to a position where two sides, that adjacent and are connected to each other, of the display device 1000 intersect. For example, in a case where the display device 1000 is in a shape of a rectangle, the term "corner" refers to a position where a long side intersects a short side of the display device 1000. The position is generally curved, i.e., a smooth transition to the two sides.

In order to solve the above problem, some embodiments of the present disclosure provide a heat dissipation assembly 20.

Figure 5:
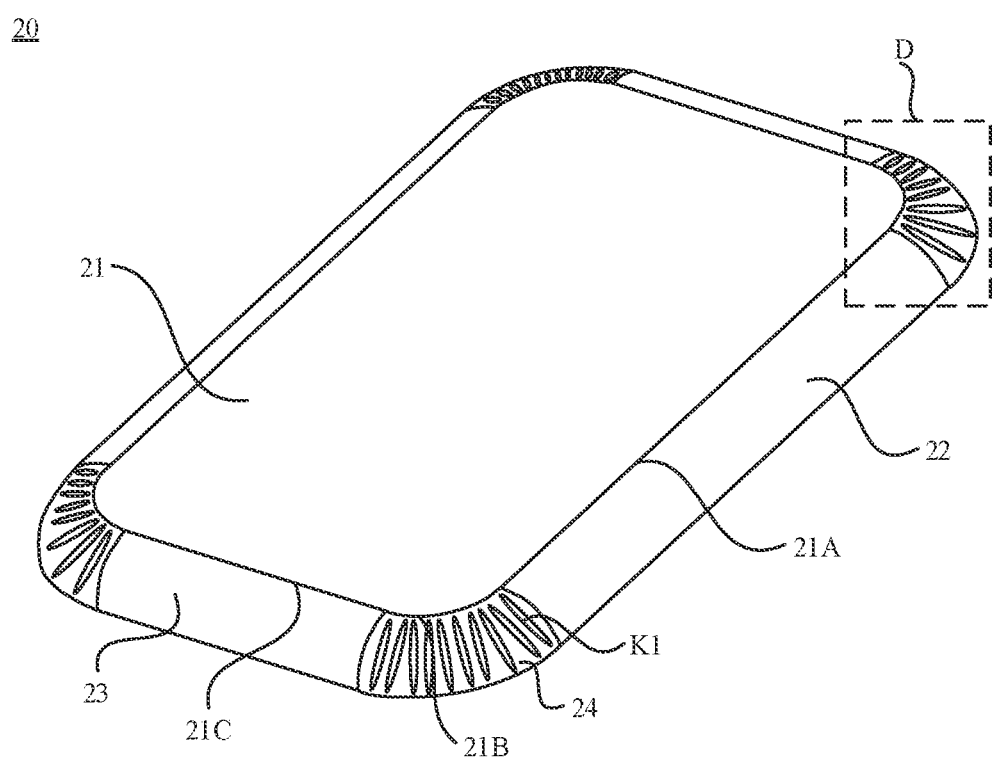
FIG. 5 is a structural diagram of a heat dissipation assembly, in accordance with some embodiments.

Referring to FIG. 5, the heat dissipation assembly 20 includes a heat dissipation layer main body 21, first bending portion(s) 22, second bending portion(s) 23, and corner bending portion(s) 24.

The heat dissipation layer main body 21 includes first side(s) 21A, arc-shaped corner side(s) 21B, and second side(s) 21C, and a first side 21A, an arc-shaped corner side 21B and a second side 21C are connected in sequence. Extending directions of the first side 21A and the second side 21C intersect with each other. The first side 21A is connected to the second side 21C by the arc-shaped corner side 21B, so that an outer contour of the heat dissipation layer main body 21 is smooth.

Referring to FIG. 5, a first bending portion 22 is connected to the first side 21A, a second bending portion 23 is connected to the second side 21C, and a corner bending portion 24 is connected to the arc-shaped corner side 21B.

The first bending portion 22, the corner bending portion 24 and the second bending portion 23 are sequentially connected, and the first bending portion 22, the corner bending portion 24 and the second bending portion 23 are all bent toward a direction away from the display panel 10.

The first bending portion 22, the corner bending portion 24 and the second bending portion 23 each have an angle with respect to the heat dissipation layer main body 21. The first bending portion 22, the corner bending portion 24 and the second bending portion 23 are sequentially connected to each other to constitute a portion of the heat dissipation assembly 20 located in the curved surface display region A2.

The corner bending portion 24 is provided with at least one first opening K1 therein.

In the display module 1000 provided by the embodiments of the disclosure, the corner bending portion 24 is provided with first opening(s) K1 therein. That is, a portion, corresponding to the corner, of the heat dissipation assembly 20 is provided with first opening(s) K1 therein. In this way, it is possible to use the deformation of the first opening(s) K1 to absorb the stress concentrated at the corner bending portion 24, thereby reducing the risk of wrinkle or crack of the heat dissipation assembly 20 at the corner during the process of bending and attaching the heat dissipation assembly 20 to the display panel 10, and ameliorating the problems of poor heat dissipation effect caused by poor attachment and poor attachment of the heat dissipation assembly 20.

Figure 6:
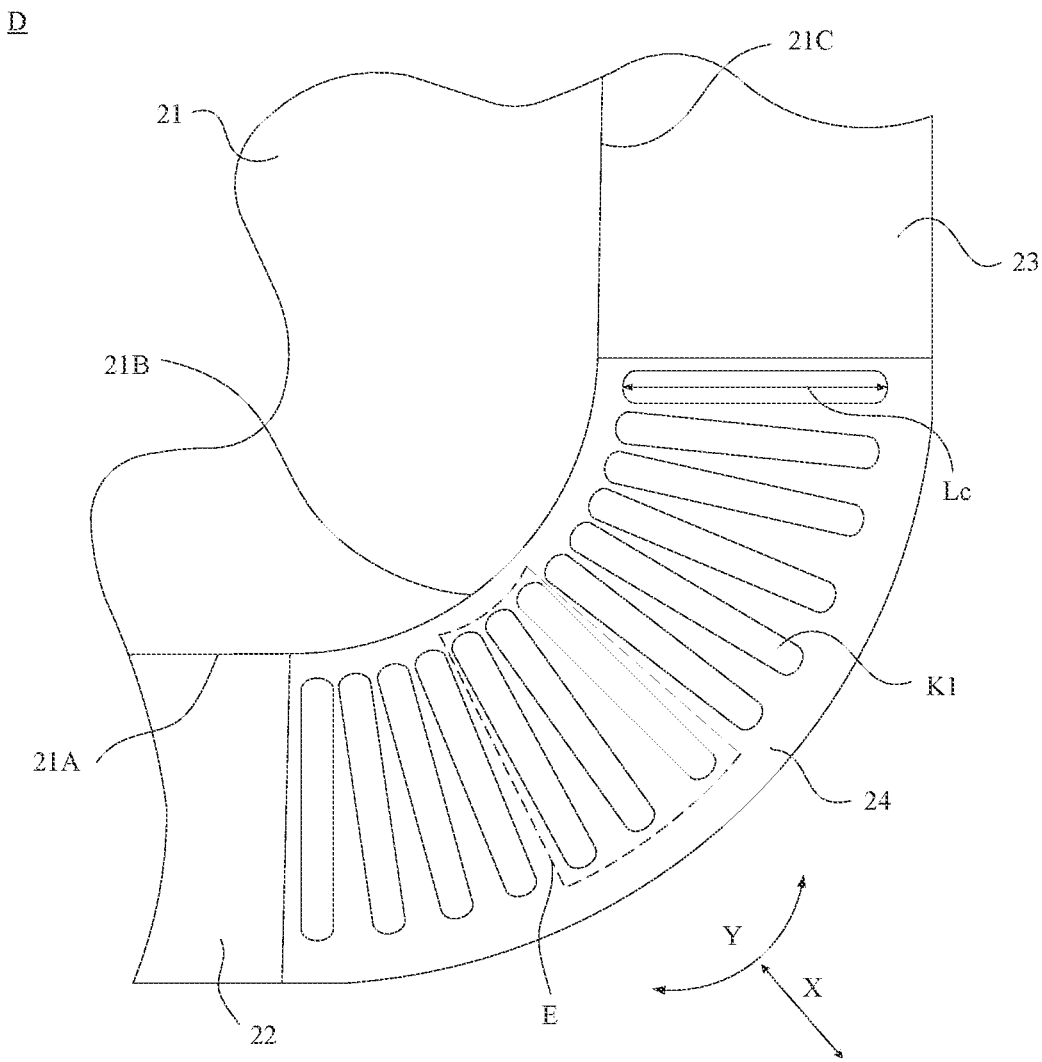
FIG. 6 is an enlarged view of the region D shown in FIG. 5.

As shown in FIG. 6, the first opening K1 is in a shape of a strip, and the first opening K1 extends substantially in a radial direction X of the arc-shaped corner side 21B. That is, a length direction of the first opening K1 is the same as the radial direction X of the arc-shaped corner side 21B.

For example, the first opening K1 has various shapes such as a rectangle, an oval, an irregular strip, a baseball bat, and a baseball.

In a case where the corner bending portion 24 is provided with a plurality of first openings K1 therein, the plurality of first openings K1 are sequentially arranged at intervals in an extending direction Y of the arc-shaped corner side 21B. For example, referring to FIG. 6, the plurality of first openings K1 are radially distributed in the corner bending portion 24.

By arranging the first opening K1 to be in a shape of a strip, and the first opening K1 extends in the radial direction X of the arc-shaped corner side 21B, the first opening K1 may release the tensile force and pressing force on the corner bending portion 24, and reduce the risk of wrinkle or crack of the corner bending portion 24 during the bending and attaching process.

Figure 7:
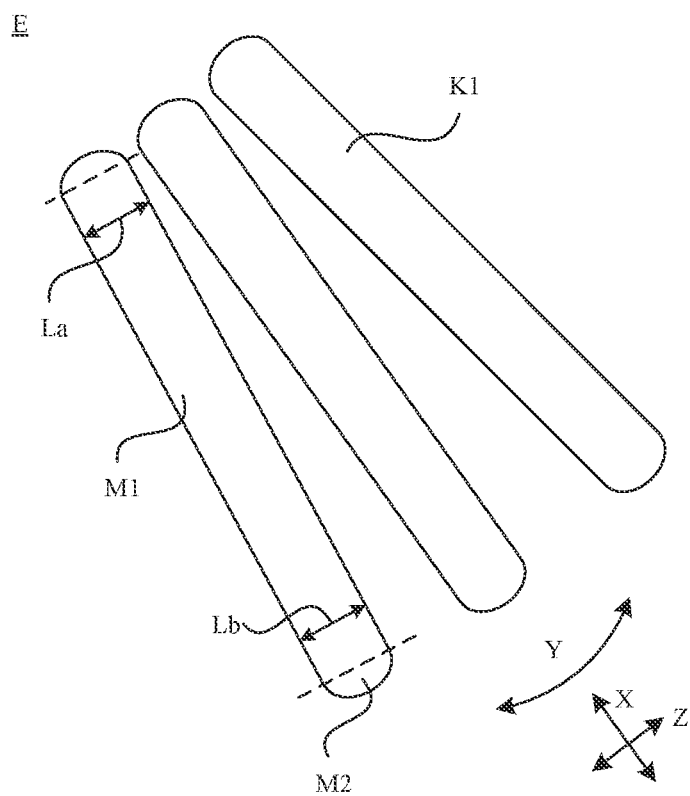
FIG. 7 is an enlarged view of the region E shown in FIG. 6.
Figure 8:
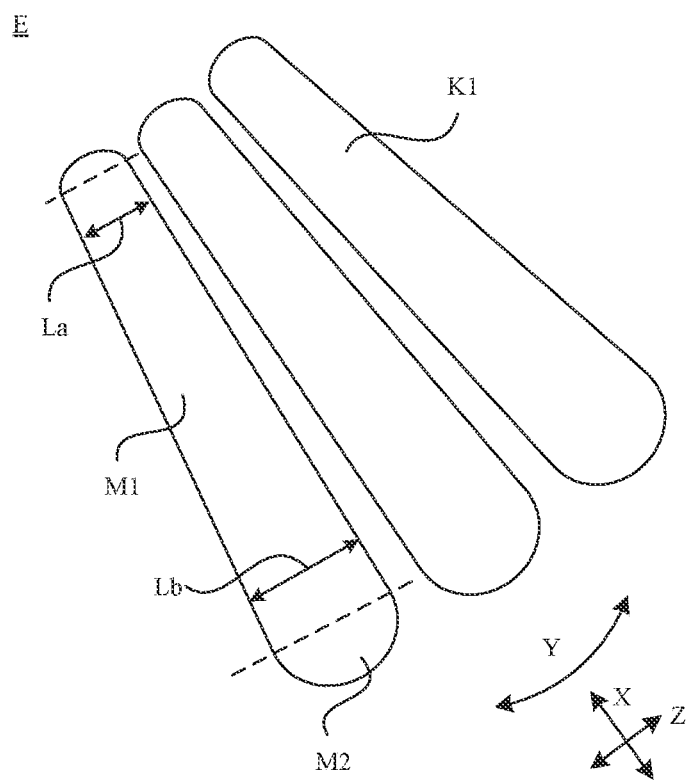
FIG. 8 is another enlarged view of the region E shown in FIG. 6.

In some embodiments, as shown in FIGS. 7 and 8, the first opening K1 includes a first main body portion M1 and two first end portions M2 respectively disposed at two ends of the first main body portion M1; the first main body portion M1 is in a shape of a strip, and the first main body portion M1 extends substantially in the radial direction X of the arc-shaped corner side 21B.

For example, the first main body portion M1 is in a shape of a rectangle.

For example, the first opening K1 is integrally formed; that is, the first main body portion M1 and the two first end portions M2 are integrally formed.

For example, the first main body portion M1 is a portion of the first opening K1 that is located at a middle region and regularly changes in shape and size, and the two first end portions M2 are portions of the first opening K1 that are located at both ends and changes in shape and size different from the first main body portion M1.

For example, in a case where the entire first opening K1 changes in shape and size uniformly, the first opening K1 may include only the first main body portion M1. For example, in a case where the first opening K1 is in a shape of a rectangle, the shape and size of the first opening K1 are constant, and thus the first opening K1 includes only the first main body portion M1.

Referring to FIG. 7, a width La of an end of the first main body portion M1 proximate to the arc-shaped corner side 21B is equal to a width Lb of another end of the first main body portion M1 away from the arc-shaped corner side 21B.

For example, referring to FIG. 7, widths of the first main body portion M1 at different positions are substantially equal. That is, the first main body portion M1 has a uniform width.

The term "width" is a dimension in a setting direction Z. The setting direction Z is perpendicular to a length extension direction of the first main body portion M1. For example, referring to FIG. 7, the first main body portion M1 extends substantially in the radial direction X of the arc-shaped corner side 21B. That is, the length extension direction of the first main body portion M1 is the same as the radial direction X of the arc-shaped corner side 21B, and the setting direction Z is perpendicular to the radial direction X of the arc-shaped corner side 21B.

For the first opening K1, the width La of the end of the first main body portion M1 proximate to the arc-shaped corner side 21B is equal to the width Lb of the end of the first main body portion M1 away from the arc-shaped corner side 21B. Thus, the stress to which the corner bending portion 24 is subjected at any position in the radial direction X of the arc-shaped corner side 21B is sufficiently released.

In some embodiments, referring to FIG. 8, a width La of an end of the first main body portion M1 proximate to the arc-shaped corner side 21B is equal to a width Lb of another end of the first main body portion M1 away from the arc-shaped corner side 21B.

For example, referring to FIG. 8, the width of the first main body portion M1 gradually increases from the end of the first main body portion M1 proximate to the arc-shaped corner side 21B to the end of the first main body portion M1 away from the arc-shaped corner side 21B.

Of the first main body portion M1 provided with the first opening(s) K1, the width La of the end proximate to the arc-shaped corner side 21B is smaller than the width Lb of the end away from the arc-shaped corner side 21B, so that it is possible to respectively provide the stress release in different degrees for a position, proximate to the arc-shaped corner side 21B, of the corner bending portion 24 and a position, away from the arc-shaped corner side 21B, i.e., to provide stress release in different degrees adapted to different positions subjected the stress in different degrees of the corner bending portion 24. As a result, the corner bending portion 24 after bending and attaching is subjected to the uniform stress, and the possibility of wrinkles or cracking of the corner bending portion 24 is further reduced.

Figure 9:
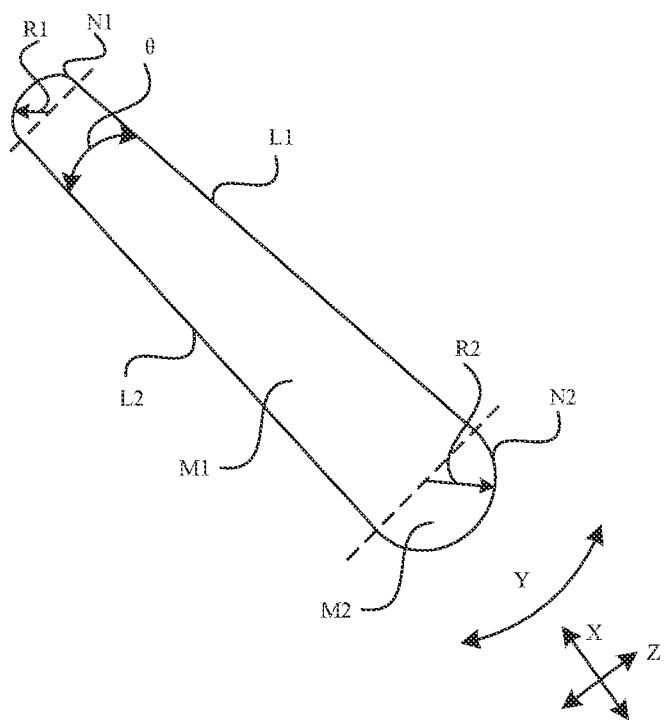
FIG. 9 is a structural diagram of a first opening, in accordance with some embodiments.

In exemplary embodiments, referring to FIG. 9, the first main body portion M1 includes a first border L1 and a second border L2 that are opposite to each other. The first border L1 and the second border L2 each extend in the radial direction X of the arc-shaped corner side 21B.

For example, referring to FIG. 9, an included angle θ between the first border L1 and the second border L2 is in a range of 0° to 30°, inclusive. For example, the included angle is equal to 8°, 10°, 15°, 20° or 30°.

It will be noted that the "angle θ between the first border L1 and the second border L2" refers to an angle formed by the intersection of an extension line of the first border L1 and an extension line of the second border L2.

By setting extending directions and relative positions of the borders (the first border L1 and the second border L2) of the first opening K1, the length extending direction of the first opening K1 may be made to correspond to the tensile force, in the radial direction of the arc-shaped corner side 21B, to which the corner bending portion 24 is subjected during the bending and attaching process, so that the effect of the first opening K1 on absorbing stress is improved, and the possibility of wrinkles or cracking of the corner bending portion 24 is further reduced.

In some embodiments, as shown in FIGS. 7 to 9, two first end portions M2 of the first openings K1 are each in a shape of an arc.

Referring to FIG. 9, of the two first end portions M2 of the first opening K1, the first end portion M2 proximate to the arc-shaped corner side 218 includes a first arc-shaped border N1 curved toward the first main body portion M1, and the first end portion M2 away from the arc-shaped corner side 21B includes a second arc-shaped border N2 curved toward the first main body portion M1.

The two first end portions M2 of the first opening K1 are each in a shape of an arc, so that two ends of the first opening K1 are in a smooth state, and it is possible to prevent the first opening K1 from having an internal angle with a small angle, e.g., to prevent the first opening K1 from having a right angle or an acute angle. Thus, the strength of the corner bending portion 24 provided therein with the first opening(s) K1 is effectively improved, and the corner bending portion 24 is prevented from cracking from the inside of the first opening(s) K1, thereby further reducing the possibility of cracking of the corner bending portion 24.

In exemplary embodiments, as shown in FIG. 9, a radius of curvature R1 of the first arc-shaped border N1 is less than a radius of curvature R2 of the second arc-shaped border N2.

For example, the radius of curvature R1 of the first arc-shaped border N1 may be in a range of 0.03 mm to 0.05 mm, inclusive, such as 0.04 mm; the radius of curvature R2 of the second arc-shaped border N2 may be in a range of 0.06 mm to 0.08 mm, inclusive, such as 0.07 mm.

In exemplary embodiments, the radius of curvature R1 of the first arc-shaped border N1 is equal to the radius of curvature R2 of the second arc-shaped border N2.

In exemplary embodiments, as shown in FIG. 9, the first border L1, the first arc-shaped border N1, the second border L2, and the second arc-shaped border N2 are connected in sequence; the first arc-shaped border N1 is tangent to the first border L1 and the second border L2, and the second arc-shaped border N2 is tangent to the first border L1 and the second border L2.

Thus, it is possible to achieve the smooth transition between the first main body portion M1 and the two first end portions M2 of the first opening K1, and the corner bending portion 24 is prevented from cracking from the inside of the first opening(s) K1, so that the possibility of cracking of the corner bending portion 24 is reduced.

For example, a maximum width (a dimension in the setting direction Z) of the first arc-shaped border N1 may be greater than a width of an end of the first main body portion M1 proximate to the first arc-shaped border N1; a maximum width (a dimension in the setting direction Z) of the second arc-shaped border N2 may be greater than a width of an end of the first main body portion M1 proximate to the second arc-shaped border N2. Thus, the possibility of cracking of the first opening K1 at the first end portion M2 is further reduced.

In some embodiments, as shown in FIG. 6, the corner bending portion 24 is provided with a plurality of first openings K1 therein, and lengths Lc (dimensions in the radial direction X of the arc-shaped corner side 21B) of the plurality of first openings K1 are substantially equal.

By providing the plurality of first openings K1 in the corner bending portion 24, and making the lengths of the plurality of first openings K1 substantially equal, the stress to which the corner bending portion 24 is subjected during the bending and attaching process may be uniformly absorbed, thereby reducing the risk of wrinkling and cracking of the corner bending portion 24.

Figure 10:
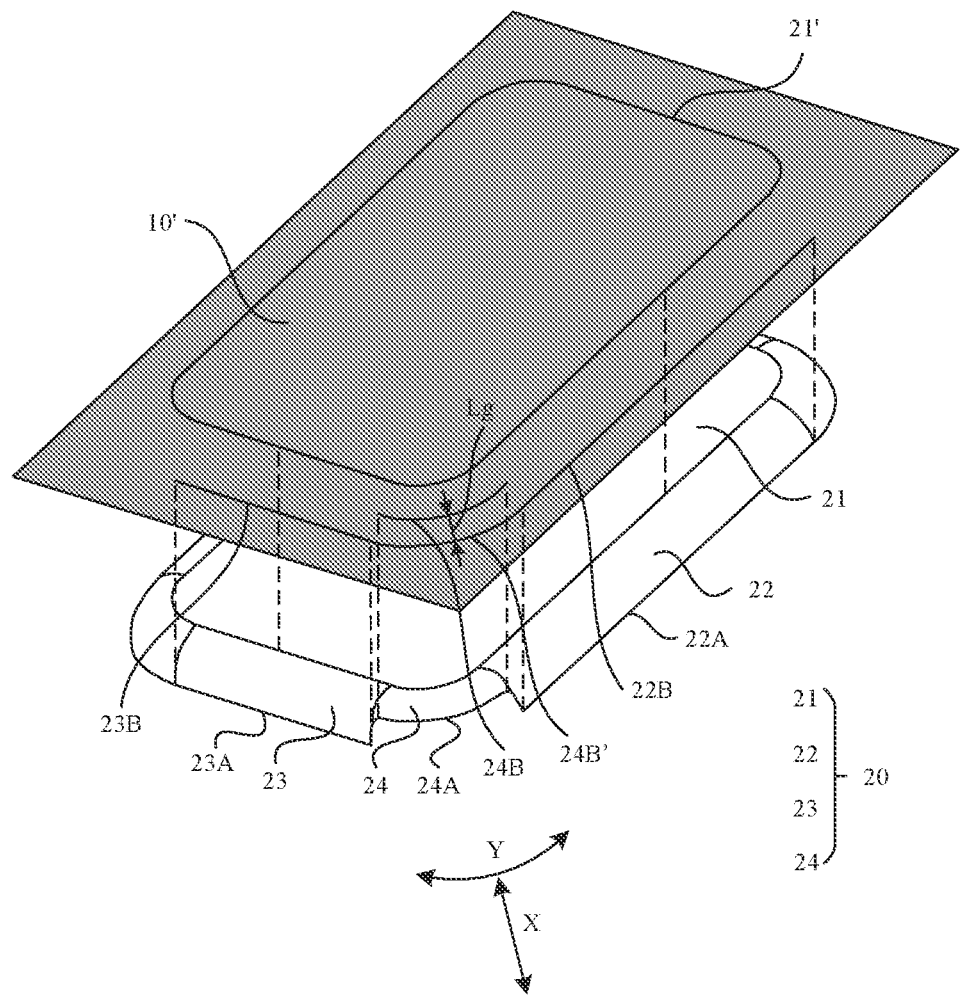
FIG. 10 is a structural diagram of another display module, in accordance with some embodiments.

In some embodiments, as shown in FIG. 10, an orthogonal projection (an arc 24B as shown in FIG. 10), on a reference surface 10', of an arc-shaped side 24A of the corner bending portion 24 away from the heat dissipation layer main body 21 is closer to an orthogonal projection 21', on the reference surface 10', of the heat dissipation layer main body 21 than a reference arc 24B'.

An orthogonal projection, on the reference plane 10', of a side 22A of the first bending portion 22 away from the heat dissipation layer main body 21 is a first projection border 22B. An orthogonal projection, on the reference plane 10', of a side 23A of the second bending portion 23 away from the heat dissipation layer main body 21 is a second projection border 23B. The reference arc 24B' is an arc tangent to the first projection border 22B and the second projection border 23B.

The reference surface 10' is parallel to the heat dissipation layer main body 21.

The corner bending portion 24 retracts inward. That is, compared to the side 22A of the first bending portion 22 away from the heat dissipation layer main body 21 and the side 23A of the second bending portion 23 away from the heat dissipation layer main body 21, a straight-line distance between the arc-shaped side 24A of the corner bending portion 24 away from the heat dissipation layer main body 21 and a geometric center of the heat dissipation assembly 20 is shorter. In this way, the tensile force to which the arc-shaped side 24A of the corner bending portion 24 away from the heat dissipation layer main body 21 is subjected may be reduced, thereby further reducing the possibility of cracking of the corner bending portion 24.

For example, a center of the orthogonal projection (i.e., the arc 24B), on the reference plane 10', of the arc-shaped side 24A of the corner bending portion 24 away from the heat dissipation layer main body 21 is the same as a center of the reference arc 24B'.

In exemplary embodiments, as shown in FIG. 10, in the radial direction X of the arc-shaped corner side 21B, a distance Lg between the orthogonal projection (i.e., the arc 24B), on the reference plane 10', of the arc-shaped side 24A of the corner bending portion 24 away from the heat dissipation layer main body 21 and the reference arc 24B' is in a range of 1 mm to 2 mm, inclusive. For example, the distance is equal to 1 mm, 1.25 mm, 1.5 mm or 2 mm.

By limiting the position of the arc-shaped side 24A of the corner bending portion 24 away from the heat dissipation layer main body 21, the stress to which the corner bending portion 24 is subjected is reduced, and moreover, it is possible to ensure that the corner bending portion 24 may still cover the signal lines at the corner of the display panel 10 after retraction, thereby avoiding reduction of the heat dissipation effect of the heat dissipation assembly 20.

Figure 11:
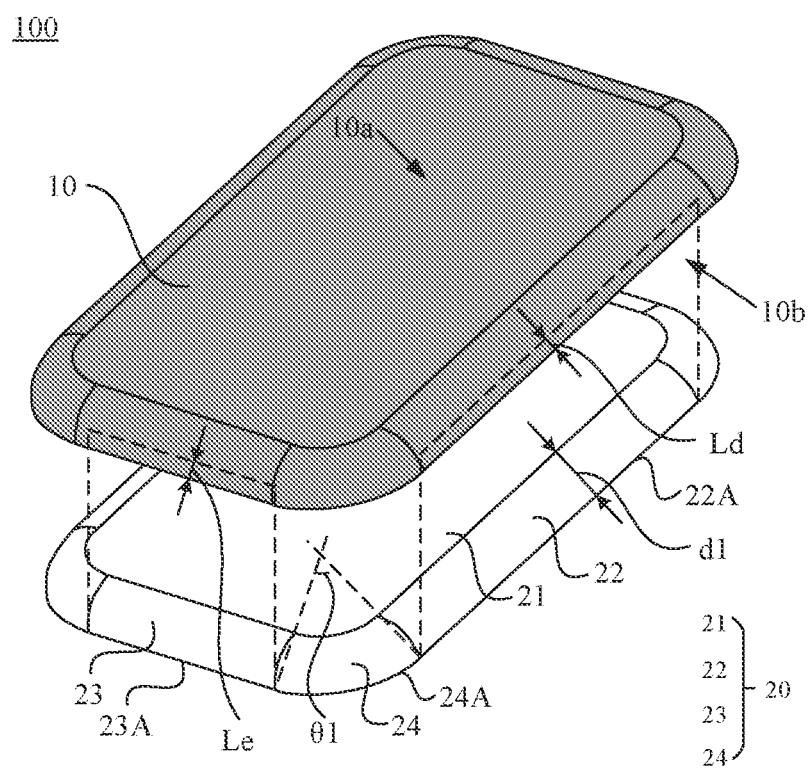
FIG. 11 is a structural diagram of yet another display module, in accordance with some embodiments.

In some embodiments, as shown in FIG. 11, an orthogonal projection of the heat dissipation assembly 20 on the display panel 10 is within a region where the display panel 10 is located. For example, an area of the heat dissipation assembly 20 is smaller than an area of the display panel 10, and a side of the heat dissipation assembly 20 retracts relative to a side of the display panel 10.

For example, referring to FIG. 11, in a direction parallel to the light exit surface 10a of the display panel 10 and perpendicular to an extending direction of the first bending portion 22, there is a distance Ld between the side 22A of the first bending portion 22 away from the heat dissipation layer main body 21 and a side, of which an extending direction is the same as an extending direction of the side 22A of the first bending portion 22, of the display panel 10. The minimum value of the distance Ld may be in a range of 0.2 mm to 0.4 mm, inclusive. For example, the minimum value of the distance Ld may be 0.2 mm, 0.25 mm, 0.3 mm, 0.375 mm or 0.4 mm.

For example, referring to FIG. 11, in a direction parallel to the light exit surface 10a of the display panel 10 and perpendicular to an extending direction of the second bending portion 23, there is a distance Le between a side 23A of the second bending portion 23 away from the heat dissipation layer main body 21 and a side, of which an extending direction is the same as an extending direction of the side 23A of the second bending portion 23, of the display panel 10. The minimum value of the distance Le may be in a range of 0.2 mm to 0.4 mm, inclusive. For example, the minimum value of the distance Le may be 0.2 mm, 0.25 mm, 0.3 mm, 0.375 mm or 0.4 mm.

For example, referring to FIG. 11, in a case where a radius of curvature of a curved surface, formed by bending the side of the display panel 10, in the backlight surface 10b is approximately equal to 2 mm, the widths d1 (dimensions in a direction perpendicular to the extending direction of the side bending portions) of the side bending portions (including the first bending portion 22 and the second bending portion 23) of the heat dissipation assembly 20 may each be in a range of 2.34 mm to 2.74 mm, inclusive, such as 2.54 mm; a central angle θ of the arc-shaped side 24A of the corner bending portion 24 away from the heat dissipation layer main body 21 may be in a range of 69° to 79°, inclusive, such as 74°.

Figure 12:
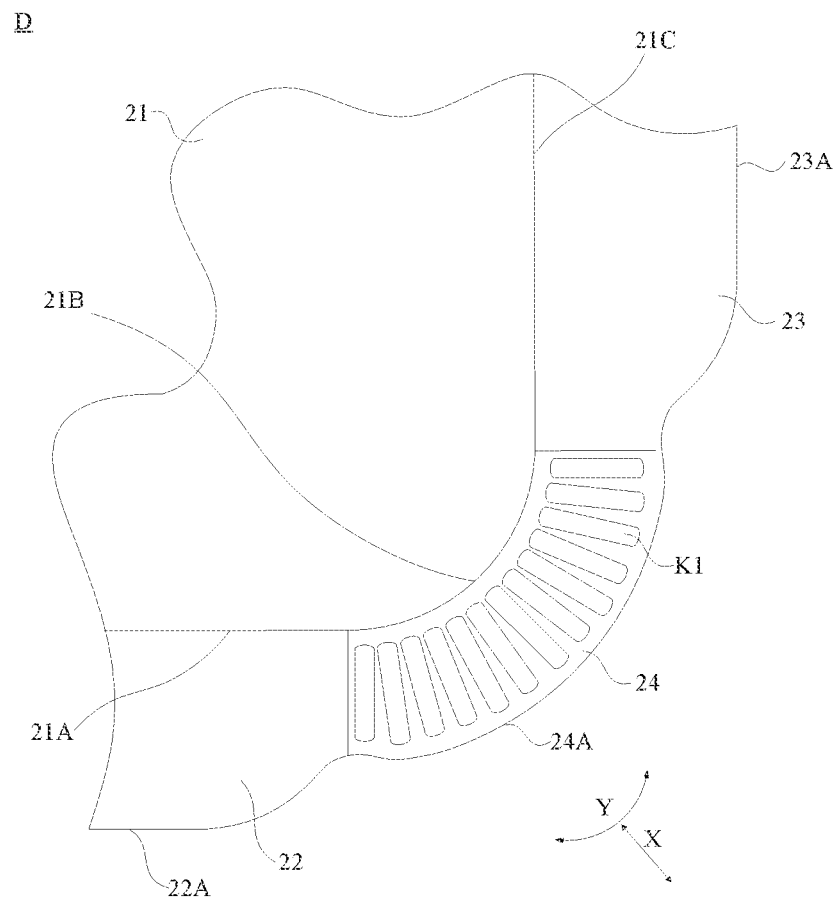
FIG. 12 is another enlarged view of the region D shown in FIG. 5.

In some embodiments, as shown in FIG. 12, the side 22A of the first bending portion 22 away from the heat dissipation layer main body 21 and the side 23A of the second bending portion 23 away from the heat dissipation layer main body 21 each have an arc-shaped transition with the arc-shaped side 24A of the corner bending portion 24 away from the heat dissipation layer main body 21.

For example, referring to FIG. 12, the side 22A of the first bending portion 22 away from the heat dissipation layer main body 21 is connected to the arc-shaped side 24A of the corner bending portion 24 away from the heat dissipation layer main body 21 by an arc; the side 23A of the second bending portion 23 away from the heat dissipation layer main body 21 is connected to the arc-shaped side 24A of the corner bending portion 24 away from the heat dissipation layer main body 21 by an arc.

By providing arc-shaped transitions, it is possible to avoid the formation of angles at the position where the side 22A of the first bending portion 22 away from the heat dissipation layer main body 21 is connected to the arc-shaped side 24A of the corner bending portion 24 away from the heat dissipation layer main body 21 and the position where the side 23A of the second bending portion 23 away from the heat dissipation layer main body 21 is connected to the arc-shaped side 24A of the corner bending portion 24 away from the heat dissipation layer main body 21, so that the heat dissipation assembly 20 is prevented from producing cracks in the transition regions (the connection positions described above), and the risk of cracking of the heat dissipation assembly 20 in the bending and attaching process is further reduced.

Figure 13:
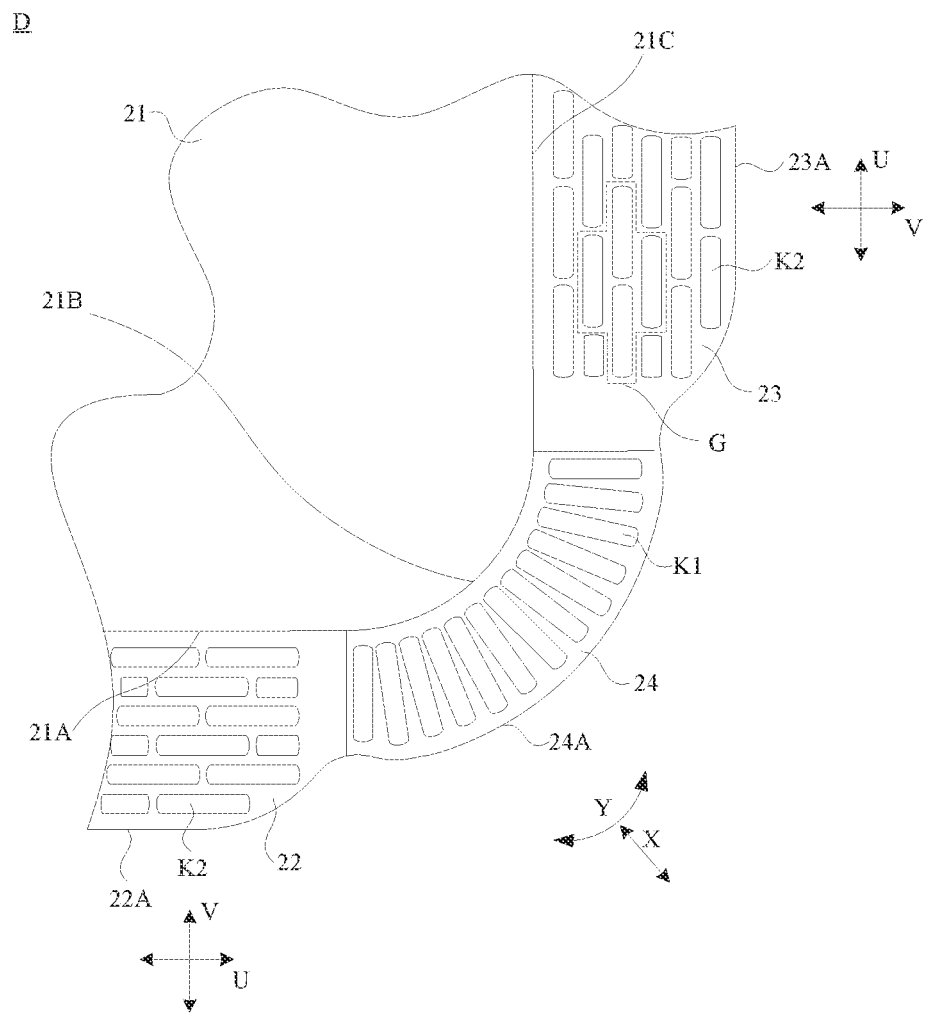
FIG. 13 is yet another enlarged view of the region D shown in FIG. 5.

In some embodiments, as shown in FIG. 13, the first bending portion 22 is provided with at least one second opening K2 therein; alternatively, the second bending portion 23 is provided with at least one second opening K2 therein; alternatively, as shown in FIG. 13, the first bending portion 22 and the second bending portion 23 are each provided with at least one second opening K2 therein.

By providing the second opening(s) K2 in the first bending portion 22 and/or the second bending portion 23, the stress to which the first bending portion 22 and/or the second bending portion 23 is subjected during the bending and attaching process may be absorbed by deformation of the second opening(s) K2, so that the risk of wrinkles or cracks at the side bending portions of the heat dissipation assembly 20 during the bending and attaching process is reduced, and the problems of poor attachment and poor heat dissipation effect of the heat dissipation assembly 20 are solved.

In exemplary embodiments, as shown in FIG. 13, the second opening K2 is in a shape of a strip, and the second opening K2 extends substantially in an extending direction of a side (e.g., the first side 21A or the second side 21C), connected to a side bending portion (e.g., the first bending portion 22 or the second bending portion 23) where the second opening K2 is located, of the heat dissipation layer main body 21.

For example, the second opening K2 disposed in the first bending portion 22 extends in the extending direction of the first side 21A. That is, a length direction of the second opening K2 disposed in the first bending portion 22 is the same as the extending direction of the first side 21A. The second opening K2 disposed in the second bending portion 23 extends in the extending direction of the second side 21C. That is, a length direction of the second opening K2 disposed in the second bending portion 23 is the same as the extending direction of the second side 21C.

In a case where the first bending portion 22 and/or the second bending portion 23 is provided with a plurality of second openings K2 therein, the plurality of second openings K2 are arranged in at least one row, second openings K2 in each row are sequentially arranged at intervals in a first direction U, and in a case where the plurality of second openings K2 are arranged in a plurality of rows, the plurality of rows of second openings K2 are arranged in parallel in a second direction V.

The first direction U is the extending direction of the side, connected to the side bending portion (e.g., the first bending portion 22 or the second bending portion 23) where the second openings K2 are located, of the heat dissipation layer main body 21. The second direction V intersects the first direction U. For example, the second direction V is perpendicular to the first direction U.

For example, the plurality of second openings K2 disposed in the first bending portion 22 are arranged in at least one row, second openings K2 in each row are sequentially arranged at intervals in the first direction U; in a case where the plurality of second openings K2 are arranged in a plurality of rows, the plurality of rows of second openings K2 are arranged in parallel in the second direction V. In this case, the first direction U is the extending direction of the first side 21A.

For example, the plurality of second openings K2 disposed in the second bending portion 23 are arranged in at least one row, second openings K2 in each row are sequentially arranged at intervals in the first direction U; in a case where the plurality of second openings K2 are arranged in a plurality of rows, the plurality of rows of second openings K2 are arranged in parallel in the second direction V. In this case, the first direction U is the extending direction of the second side 21C.

The plurality of second openings K2 are disposed in the side bending portions (including the first bending portion 22 and the second bending portion 23), and the second openings K2 are arranged in rows and columns. Thus, the second openings K2 are uniformly distributed in the side bending portions of the heat dissipation assembly 20, so that the stress to which the side bending portions are subjected is absorbed uniformly during the bending and attaching process. As a result, the stress to which the entire side bending portions are subjected is relatively small and uniform, thereby further reducing the risk of wrinkle or crack of the side bending portions.

Figure 14:
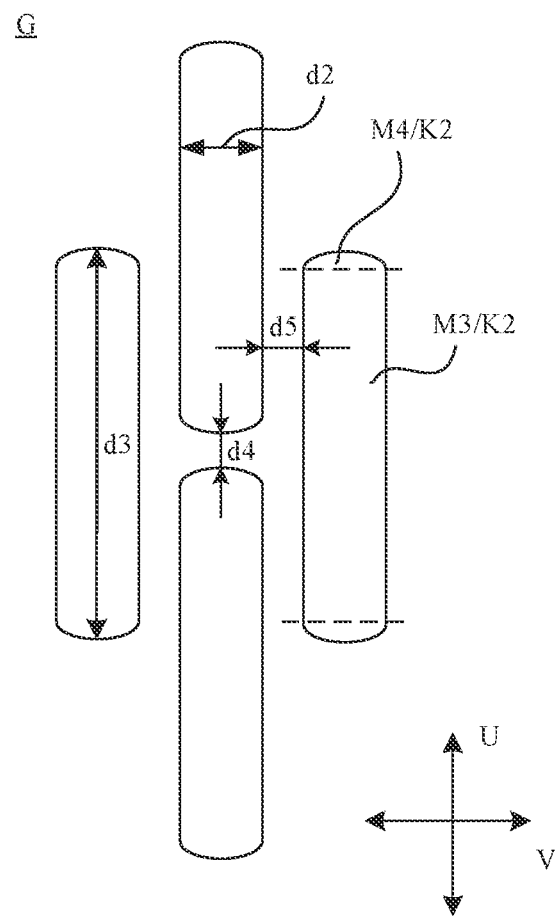
FIG. 14 is an enlarged view of the region G shown in FIG. 13.

In some embodiments, as shown in FIG. 14, the plurality of second openings K2 are arranged in a plurality of rows. In the second direction V. of two adjacent rows of second openings K2, a gap between two second openings K2 that are adjacently arranged in one row is provided to be staggered with a gap between two second openings K2 that are adjacently disposed in the other row.

For example, referring to FIG. 14, of two adjacent rows of second openings K2, a geometric center of a second opening K2 in one row and a center of a gap between two second openings K2 that are adjacently arranged in the other row are substantially located in a same straight line extending in the second direction V. Thus, second openings K2 in two adjacent rows are staggered in the second direction V, so that the second openings K2 are distributed more uniformly. As a result, the stress to which the side bending portion is subjected is more uniform, thereby further reducing the risk of wrinkles, cracks and other undesirable situations of the heat dissipation assembly 20 at the side bending portion.

Figure 15:
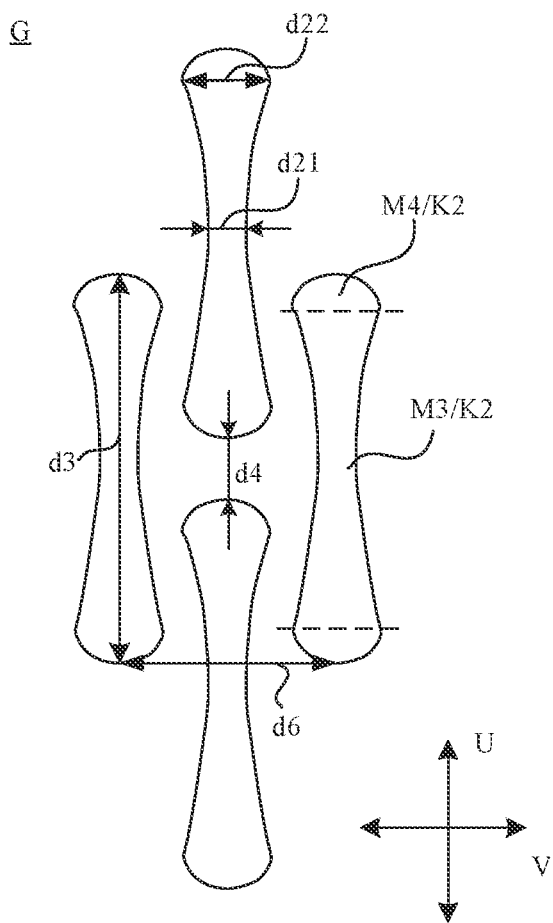
FIG. 15 is another enlarged view of the region G shown in FIG. 13.

In some embodiments, as shown in FIGS. 14 and 15, the second opening K2 includes a second main body portion M3 and two second end portions M4 respectively disposed at two ends of the second main body portion M3. The second main body portion M3 is in a shape of a strip, and extends in an extending direction (e.g., the first direction U) of a side, connected to a side bending portion where the second opening K2 is located, of the heat dissipation layer main body 21.

For example, the second main body portion M3 of the second opening K2 provided in the first bending portion 22 extends substantially in the extending direction of the first side 21A; the second main body M3 of the second opening K2 provided in the second bending portion 23 extends substantially in the extending direction of the second side 21C.

For example, the second main body portion M3 is in a shape of a rectangle.

For example, the second opening K2 is integrally formed. That is, the second main body portion M3 and the two second end portions M4 are integrally formed.

For example, the second main body portion M3 is a portion of the second opening K1 that is located at a middle region and regularly changes in shape and size, and the two second end portions M4 are portions of the second opening K1 that are located at both ends and changes in shape and size different from the second main body portion M3.

For example, in a case where the entire second opening K2 changes in shape and size uniformly, the second opening K2 may include only the second main body portion M3. For example, in a case where the second opening K2 is in a shape of a rectangle, the shape and size of the second opening K2 are constant, and thus the second opening K2 includes only the second main body portion M3.

In exemplary embodiments, as shown in FIG. 14, in a length extending direction of the second main body portion M3, widths d2 of the second main body portion M3 at multiple positions are substantially equal. That is, the second main body portion M3 has a uniform width.

In the length extending direction of the second main body portion M3, widths d2 of the second main body portion M3 at multiple positions are substantially equal, so that the stress to which the side bending portion, provided with the second opening K2, is subjected in the bending and attaching process is sufficiently and uniformly released.

For example, as shown in FIG. 14, a length d3 (a dimension in the first direction U) of the second opening K2 may be in a range of 2 mm to 4 mm, inclusive, such as 3 mm, a width (i.e., a setting dimension d2) of the second main body portion M3 may be in a range of 0.09 mm to 0.11 mm, inclusive, such as 0.1 mm; a distance d4 between two adjacent second openings K2 in a same row may be in a range of 0.09 mm to 0.11 mm, inclusive, such as 0.1 mm; a distance d5 between two adjacent rows of second openings K2 may be in a range of 0.07 mm to 0.09 mm, inclusive, such as 0.08 mm.

In exemplary embodiments, as shown in FIG. 15, in the length extending direction of the second main body portion M3, the width of the second main body portion M3 is gradually decreased and then gradually increased from one second end portion M4 of the second opening K2 to the other second end portion M4. That is, a width of the second opening K2 at the geometric center is small, widths of the second opening K2 at both ends are large, and the second opening K2 has a substantially baseball shape as a whole.

For example, the width of the second opening K2 at the geometric center is small, the widths of the second opening K2 at both the ends is large, and the second openings K2 in two adjacent rows are staggered with each other in the second direction V. For example, of two adjacent rows of second openings K2, a second end portion M4 of a second opening K2 in one row corresponds to a geometric center of a second opening K2 in the other row.

The second openings K2 has a substantially baseball shape, so that the plurality of second openings K2 are distributed more uniformly in the case where two adjacent rows of second openings K2 are staggered in the second direction V. As a result, the stress to which the side bending portion, provided with the second openings K2, is subjected is more uniform in the bending and attaching process, thereby reducing the risk of wrinkles and cracks of the heat dissipation assembly 20 at the side bending portion.

For example, as shown in FIG. 15, the length d3 (the dimension in the first direction U) of the second opening K2 may be in a range of 2.3 mm to 2.7 mm, inclusive, such as 2.5 mm; the minimum width of the second opening K2 (e.g., the width d21 of the second opening K2 at the geometric center) may be in a range of 0.06 mm to 0.08 mm, inclusive, such as 0.07 mm; the maximum width of the second opening K2 (e.g., the maximum width d22 of the second opening K2 at the second end M4) may be in a range of 0.10 mm to 0.12 mm, inclusive, such as 0.11 mm; the distance d4 between two adjacent second openings K2 arranged in a same row may be in a range of 0.14 mm to 0.16 mm, inclusive, such as 0.15 mm; a distance d6 between two rows of second openings K2 respectively arranged on two sides of a same row of second openings K2 may be in a range of 0.2 mm to 0.4 mm, inclusive, such as 0.3 mm.

In some embodiments, as shown in FIGS. 14 and 15, the two second end portions M4 of the second opening K2 are each in a shape of an arc, and two ends of an arc-shaped border of the second end portion M4 are respectively connected to two opposite borders of the second main body portion M3.

The two second end portions M4 of the second opening K2 are each in a shape of an arc, so that two ends of the second opening K2 are in a smooth state, and it is possible to prevent the second opening K2 from having an internal angle with a small angle, e.g., to prevent the second opening K2 from having a right angle or an acute angle. Thus, the strength of the side bending portion provided therein with the second opening(s) K2 is effectively improved, and the side bending portion is prevented from cracking from the inside of the second opening(s) K2, thereby further reducing the possibility of cracking of the side bending portion of the heat dissipation assembly 20.

In exemplary embodiments, radii of curvature of the arc-shaped borders of the two second end portions M4 are substantially equal.

In exemplary embodiments, the arc-shaped border of the second end portion M4 is tangent to the two opposite borders of the second main body portion M3. Thus, it is possible to achieve the smooth transition between the second main body portion M3 and the two second end portions M2 of the second opening K2, thereby reducing the possibility of cracking of the side bending portion, provided with the second opening(s) K2, on a side of the heat dissipation assembly 20.

Figure 16:
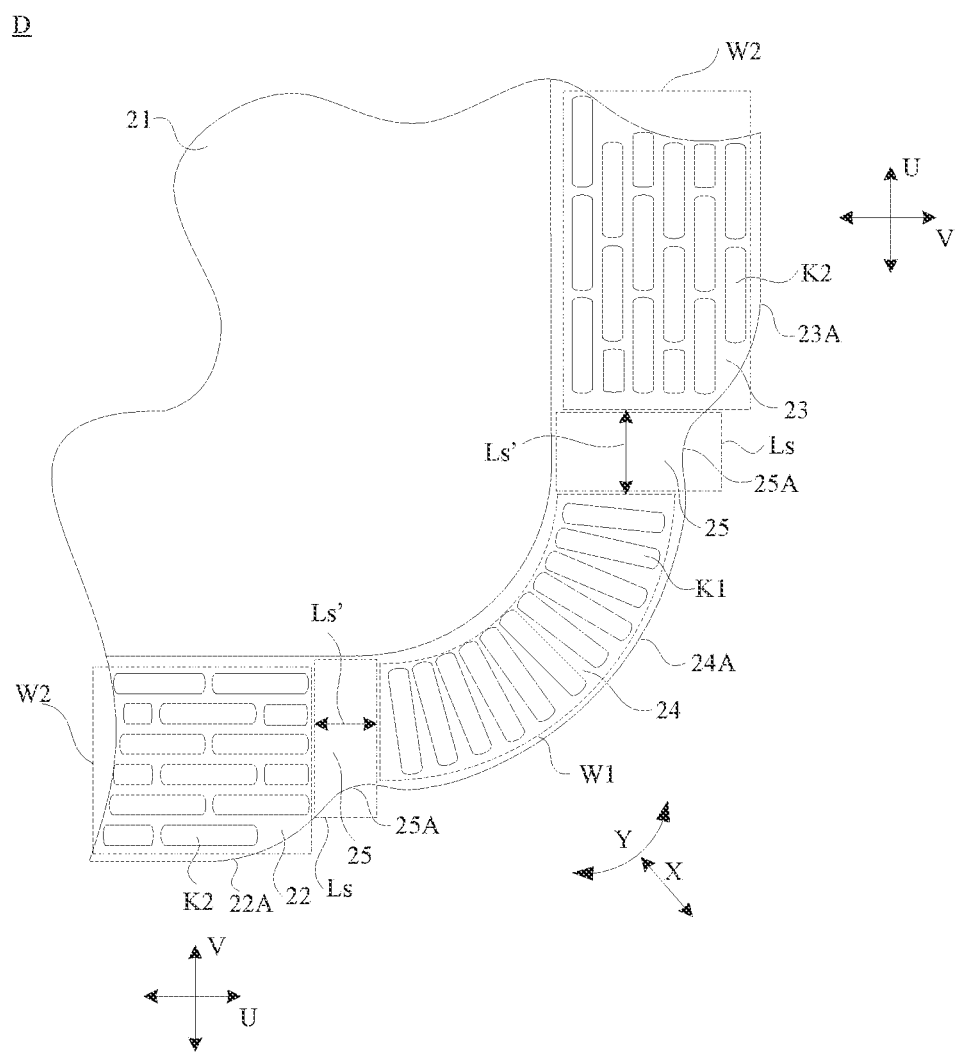
FIG. 16 is yet another enlarged view of the region D shown in FIG. 5.

In some embodiments, as shown in FIG. 16, the corner bending portion 24 is provided with a plurality of first openings K1 therein, and the first bending portion 22 and/or the second bending portion 23 is provided with a plurality of second openings K2 therein; a transition region Ls is provided between a region W1 where the plurality of first openings K1 are located and a region W2 where the plurality of second openings K2 are located.

A width Ls' of the transition region Ls is approximately in a range of 1 mm to 2.5 mm, inclusive, and the transition region Ls is not provided with openings (including the first opening K1 and the second opening K2).

For example, referring to FIG. 16, the width Ls' of the transition region Ls between the region W1 where the plurality of first openings K1 are located and the region W2 where the plurality of second openings K2 are located is approximately in a range of 1 mm to 2.5 mm, inclusive. For example, the width Ls' is approximately 1 mm, 1.25 mm, 1.5 mm, 2 mm or 2.5 mm.

The transition region Ls is arranged between the region W1 where the plurality of first openings K1 are located and the region W2 where the plurality of second openings K2 are located. Thus, of the heat dissipation assembly 20, a portion between the corner bending portion 24 and the first bending portion 22 and a portion between the corner bending portion 24 and the second bending portion 23 each have a certain strength, so that the portions, between the corner bending portion 24 and the side bending portions (including the first bending portion 22 and the second bending portion 23), of the heat dissipation assembly 20 are prevented from being damaged when the stress concentration is produced in the bending and attaching process.

In exemplary embodiments, as shown in FIG. 16, the heat dissipation assembly 20 further includes transition portions 25, the transition portions 25 are respectively disposed in the transition regions Ls, and the transition portions 25 are connected to the first bending portion 22 and the second bending portion 23, respectively.

The transition portion 25 includes an arc-shaped transition side 25A, and the arc-shaped transition side 25A is curved toward a direction in which the transition portion 25 is away from the heat dissipation layer main body portion 21.

The side 22A of the first bending portion 22 away from the heat dissipation layer main body 21 and the side 23A of the second bending portion 23 away from the heat dissipation layer main body 21 are each connected to the arc-shaped side 24A of the corner bending portion 24 away from the heat dissipation layer main body 21 by the arc-shaped transition side 25A.

The provision the transition portion 25 may enhance the strength of the portion of the heat dissipation assembly 20 located between the corner bending portion 24 and the side bending portion, so that the heat dissipation assembly 20 is prevented from being broken in the transition region Ls.

The transition portion 25 includes the arc-shaped transition side 25A. Thus, it is possible to avoid the formation of angles at the position where the side 22A of the first bending portion 22 away from the heat dissipation layer main body 21 is connected to the arc-shaped side 24A of the corner bending portion 24 away from the heat dissipation layer main body 21 and the position where the side 23A of the second bending portion 23 away from the heat dissipation layer main body 21 is connected to the arc-shaped side 24A of the corner bending portion 24 away from the heat dissipation layer main body 21, so that the heat dissipation assembly 20 is prevented from producing cracks in the transition regions Ls, and the risk of cracking of the heat dissipation assembly 20 in the bending and attaching process is further reduced.

In exemplary embodiments, referring to FIG. 16, second openings K2, located at a position proximate to a border of the transition region Ls, are aligned.

In some embodiments, referring to FIG. 5, the heat dissipation layer main body 21 includes two first sides 21A disposed opposite to each other, four arc-shaped corner sides 21B, and two second sides 21C disposed opposite to each other; a single arc-shaped corner side 21B is connected between any adjacent first side 21A and second side 21C.

Each first side 21A is connected to a single first bending portion 22, each second side 21C is connected to a single second bending portion 23, and each arc-shaped corner side 21B is connected to a single corner bending portion 24. The corner bending portion 24 is provided with at least one first opening K1 therein.

That is, in the display device 1000 having four curved sides, all the portions of the heat dissipation assembly 20 located at the corners are each provided with the opening(s) (the first opening(s) K1), so that the stress to which the heat dissipation assembly 20 is subjected is released at any corner of the display device 1000 through the first openings K1. As a result, the risk of wrinkles, cracks and other undesirable situations of the heat dissipation assembly 20 at the corners is reduced.

For example, each first bending portion 22 is provided with second opening(s) K2, and each second bending portion 23 is provided with second opening(s) K2. Thus, the stress to which the heat dissipation assembly 20 is subjected is released at any side bending portion of the display device 1000 through the second openings K2, thereby reducing the risk of wrinkles, cracks and other undesirable situations of the heat dissipation assembly 20 at the side bending portion.

Figure 17:
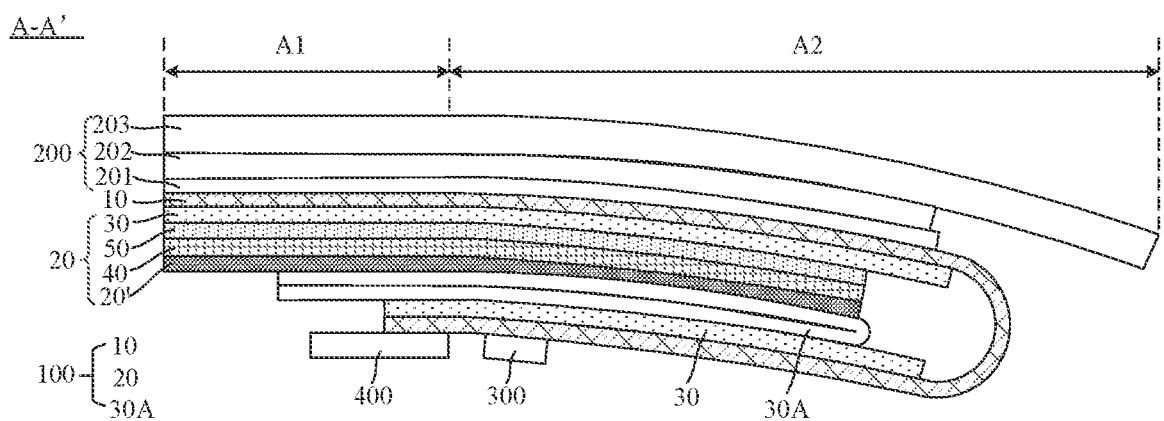
FIG. 17 is another sectional view taken along the section line A-A' in FIG. 1.

In some embodiments, as shown in FIG. 17, the heat dissipation assembly 20 includes a heat dissipation layer 20'.

The heat dissipation layer main body 21, the first bending portions 22, the second bending portions 23, and the corner bending portions 24 are located in the heat dissipation layer 20'. That is, a layer where the heat dissipation layer main body 21, the first bending portions 22, the second bending portions 23 and the corner bending portions 24 are located is the heat dissipation layer 20'. Alternatively, it can be understood that the heat dissipation layer main body 21, the first bending portions 22, the second bending portions 23 and the corner bending portions 24 are connected to constitute the heat dissipation layer 20'.

In some embodiments, as shown in FIG. 17, the heat dissipation assembly 20 further includes an adhesive layer 50 and a buffer layer 40.

As shown in FIG. 17, the adhesive layer 50 is disposed on a side of the heat dissipation layer 20'.

For example, as shown in FIG. 17, the adhesive layer 50 is disposed on a side of the heat dissipation layer 20' proximate to the display panel 10.

The adhesive layer 50 is configured to adhere to the display panel 10, thereby achieving adhesive fixation of the heat dissipation assembly 20 to the display panel 10.

The adhesive layer 50 may be a grid adhesive. That is, an orthogonal projection of the adhesive layer 50 on the display panel 10 may be in a shape of a grid, which may enhance the adhesive effect of the adhesive layer 50.

As shown in FIG. 17, the buffer layer 40 is disposed between the adhesive layer 50 and the heat dissipation layer 40.

The buffer layer 40 is configured to absorb stress and external force to which the display panel 10 is subjected during the assembly process and the subsequent usage process, so as to effectively protect the display panel 10 and other components.

A material of the buffer layer 40 may be a flexible material. For example, the buffer layer 40 may include foam.

In some embodiments, as shown in FIG. 17, the heat dissipation assembly 20 further includes a back film 30.

The back film 30 is disposed between the display panel 10 and the adhesive layer 50, and is used for protecting the backlight surface of the display panel 10. Moreover, the back film 30 provides a certain support for the bending of the display panel 10, so as to avoid the cracking caused by uneven stress when the display panel 10 is bent.

As shown in FIG. 17, the back film 30 may include two portions disconnected from each other, and one portion of the back film 30 may be bent as the display panel 10 is bent. In this case, there is no material of the back film 30 between the two portions disconnected from each other, so that a bendable portion of the display panel 10 is exposed, and the resistance when the bendable portion of the display panel 10 is bent may be reduced.

The back film 30 may be made of a flexible material. For example, the material of the back film 30 may be a polyethylene terephthalate-based plastic, such as polyethylene terephthalate (PET). Alternatively, the material of the back film 30 may be polyimide (PI) or cyclic olefin polymer (COP).

In exemplary embodiments, as shown in FIG. 17, the display module 100 further includes a support structure 30A.

The support structure 30A is disposed on a side of the back film 30 away from the display panel 10, and has a curvature, which is used as a reference for bending angles of other structural layers (e.g., the display panel 10 and the heat dissipation assembly 20) of the display module 100.

In some embodiments, a thickness (a dimension in a direction perpendicular to the display panel 10) of the heat dissipation layer 20' is greater than or equal to 100 μm.

For example, the thickness of the heat dissipation layer 20' is 100 μm, 105 μm, 300 μm or 350.8 μm.

By controlling the thickness of the heat dissipation layer 20' to be not less than 100 μm, it is possible to prevent a portion, between adjacent openings (including the first openings K1 and the second openings K2), of the heat dissipation layer 20' from being displaced or deformed during the bending and attaching process.

In some embodiments, the material of the heat dissipation layer 20' is a material with high thermal conductivity, such as a metal material or an alloy material, so as to improve the heat dissipation effect of the heat dissipation layer 20'. For example, the heat dissipation layer 20' includes a copper plate, an aluminum alloy plate, or a stainless steel plate.

The structures of the heat dissipation assembly 20, the display module 100 and the display device 1000 provided by the embodiments of the present disclosure are described above, and an assembly method of the display module 100 will be described below.

In the related art, the attaching of the heat dissipation assembly 20 is achieved by a roller. For example, the roller is arranged parallel to an extending direction of a long side of the display device 1000, and the roller is rolled from a long side of the display device 1000 to another long side of the display device 1000, so that the attaching of the heat dissipation assembly 20 to the positions of the two long sides of the display device 1000 having curved surfaces is achieved. However, this method is more suitable for a flexible screen having two curved sides. In a flexible screen having four curved sides, the heat dissipation assembly 20 cannot be attached to corners of the display device 1000 by the roller.

Figure 18:
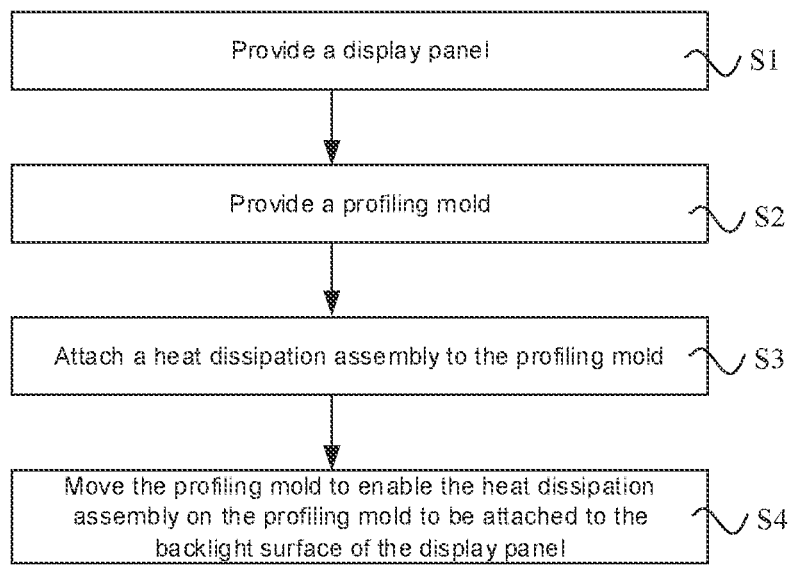
FIG. 18 is a flow diagram of an assembly method of a display module, in accordance with some embodiments.

In order to solve the above problems, some embodiments of the present disclosure provide an assembly method. As shown in FIG. 18, the assembly method includes steps S1 to S4.

In S1, a display panel is provided.

Figure 19:
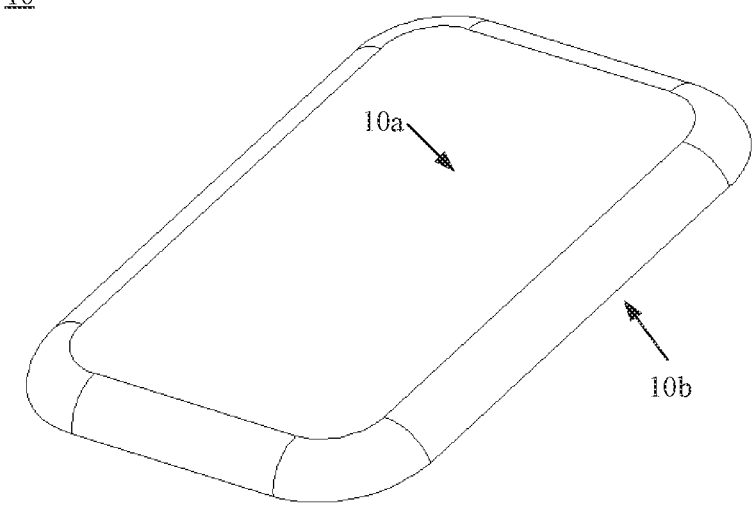
FIGS. 19 to 22 are diagrams showing steps in an assembly method of a display module, in accordance with some embodiments.

As shown in FIG. 19, the display panel 10 includes a light-exiting surface 10a and a backlight surface 10b, edges at sides and edges at corners of the display panel 10 are bent toward the backlight surface 10b.

In S2, a profiling mold is provided.

Figure 20:
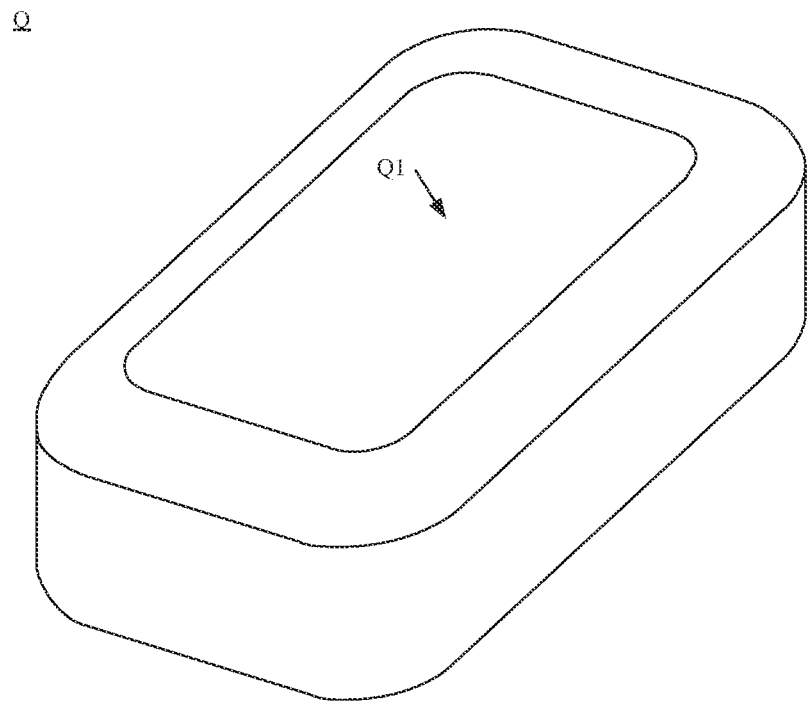

As shown in FIG. 20, the profiling mold Q has a mounting surface Q1, and a shape of the mounting surface Q1 matches the shape of the display panel 10. That is, a degree of curvature of an edge of the mounting surface Q1 of the profiling mold Q is substantially equal to a degree of curvature of an edge of the display panel 10.

In S3, the heat dissipation assembly is attached to the profiling mold.

Figure 21:
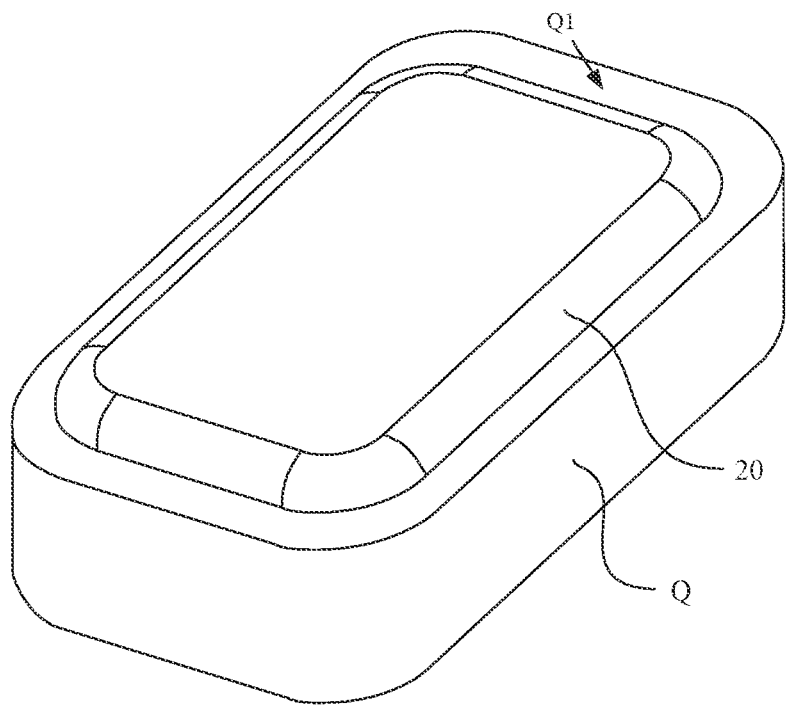

As shown in FIG. 21, the heat dissipation assembly 20 is attached to the mounting surface Q1 of the profiling mold Q, so that the heat dissipation assembly 20 having a shape matching the shape of the mounting surface Q1 of the profiling mold Q is formed. That is, the heat dissipation assembly 20 having a curved surface of which a shape matching a shape of the curved surface of the display panel 10 is formed.

In S4, the profiling mold is moved to enable the heat dissipation assembly on the profiling mold to be attached to the backlight surface of the display panel.

Figure 22:
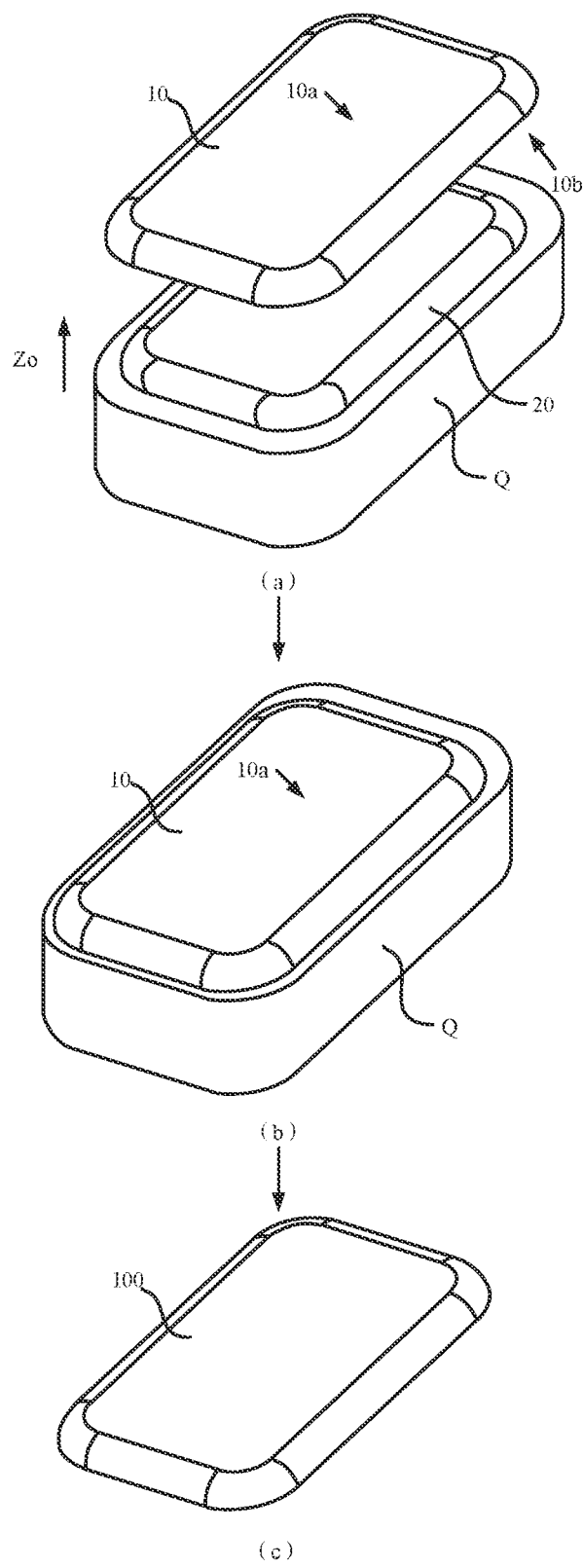

As shown in FIG. 22, the bent heat dissipation assembly 20 is completely attached to the display panel 10 by moving the profiling mold Q.

For example, as shown in (a) of FIG. 22, the display panel 10 may be disposed right above the profiling mold Q before the profiling mold Q is moved, so that the heat dissipation assembly 20 is attached to the display panel 10 successfully (as shown in (b) of FIG. 22) after the profiling mold Q is moved in a third direction Zo (e.g., a vertical direction). For example, the display panel 10 may be vacuum-adsorbed right over the profiling mold Q.

For example, as shown in (c) of FIG. 22, after the heat dissipation assembly 20 is attached to the display panel 10 successfully, the profiling mold Q is removed, and the display module 100 is obtained.

In exemplary embodiments, in a case where the display assembly 20 includes the heat dissipation layer 20', the adhesive layer 50, and the buffer layer 40, the adhesive layer 50, the buffer layer 40, and the heat dissipation layer 20' are sequentially attached together to form the heat dissipation assembly 20 before the heat dissipation assembly 20 is attached to the profiling mold Q, and then the heat dissipation assembly 20 is attached to the profiling mold Q, so that the heat dissipation assembly 20 is attached to the display panel 10 successfully.

By the assembly method of the display module 100, the attaching of the heat dissipation assembly 20 in the display device 1000 having four cured sides may be effectively achieved, so that it is possible to ensure that the heat dissipation assembly 20 is fully attached to the display panel 10; particularly, it is possible to ensure the attaching effect of the heat dissipation assembly 20 at the corners. Moreover, the risk of wrinkles and cracking after the heat dissipation assembly 20 is bent and attached is reduced, and the heat dissipation effect of the display device 1000 is improved.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A heat dissipation assembly, comprising:
   a heat dissipation layer main body including at least one first side, at least one arc-shaped corner side and at least one second side, wherein a first side, an arc-shaped corner side and a second side are sequentially connected, extending directions of the first side and the second side intersect with each other;
   at least one first bending portion, a first bending portion being connected to the first side;
   at least one second bending portion, a second bending portion being connected to the second side; and
   at least one corner bending portion, a corner bending portion being connected to the arc-shaped corner side, and the corner bending portion being provided with at least one first opening therein;
   wherein the first bending portion, the corner bending portion and the second bending portion are sequentially connected; and
   a first opening is in a shape of a strip, and the first opening extends substantially in a radial direction of the arc-shaped corner side; in a case where the corner bending portion is provided with a plurality of first openings therein, the plurality of first openings are sequentially arranged at intervals in an extending direction of the arc-shaped corner side;
   wherein the first bending portion and/or the second bending portion is provided with at least one second opening therein;
   wherein a second opening is in a shape of a strip, and the second opening extends substantially in an extending direction of a side, connected to the first bending portion or the second bending portion where the second opening is located, of the heat dissipation layer main body;
   in a case where the first bending portion and/or the second bending portion is provided with a plurality of second openings therein, the plurality of second openings are arranged in at least one row, second openings in each row are sequentially arranged at intervals in a first direction; in a case where the plurality of second openings are arranged in a plurality of rows, the plurality of rows of second openings are arranged in parallel in a second direction;
   wherein the first direction is the extending direction of the side, connected to the first bending portion or the second bending portion where the plurality of second openings are located, of the heat dissipation layer main body, and the second direction intersects the first direction.

2. The heat dissipation assembly according to claim 1, wherein the first opening includes a first main body portion and two first end portions respectively disposed at two ends of the first main body portion; the first main body portion is in a shape of a strip, and the first main body portion extends substantially in the radial direction of the arc-shaped corner side; and
   a width of an end, proximate to the arc-shaped corner side, of the first main body portion is smaller than or equal to a width of another end, away from the arc-shaped corner side, of the first main body portion.

3. The heat dissipation assembly according to claim 2, wherein the two first end portions of the first opening are each in a shape of an arc.

4. The heat dissipation assembly according to claim 3, wherein of the two first end portions of the first opening, a first end portion proximate to the arc-shaped corner side includes a first arc-shaped border curved toward the first main body portion, another first end portion away from the arc-shaped corner side includes a second arc-shaped border curved toward the first main body portion; and
   a radius of curvature of the first arc-shaped border is less than or equal to a radius of curvature of the second arc-shaped border.

5. The heat dissipation assembly according to claim 2, wherein the first main body portion includes a first border and a second border that are opposite to each other, and the first border and the second border each extend in the radial direction of the arc-shaped corner side; and
   an included angle between the first border and the second border is in a range of 0° to 30°, inclusive.

6. The heat dissipation assembly according to claim 1, wherein the corner bending portion is provided with the plurality of the first openings therein, lengths of the plurality of first openings are substantially equal.

7. The heat dissipation assembly according to claim 2, wherein an orthogonal projection, on a reference surface, of an arc-shaped side of the corner bending portion away from the heat dissipation layer main body is closer to an orthogonal projection, on the reference surface, of the heat dissipation layer main body than a reference arc; the reference surface is parallel to the heat dissipation layer main body;

wherein an orthogonal projection, on the reference plane, of a side of the first bending portion away from the heat dissipation layer main body is a first projection border; an orthogonal projection, on the reference plane, of a side of the second bending portion away from the heat dissipation layer main body is a second projection border; the reference arc is an arc tangent to the first projection border and the second projection border.

8. The heat dissipation assembly according to claim 7, wherein in the radial direction of the arc-shaped corner side, a distance between the orthogonal projection, on the reference plane, of the arc-shaped side of the corner bending portion away from the heat dissipation layer main body and the reference arc is in a range of 1 mm to 2 mm, inclusive.

9. The heat dissipation assembly according to claim 7, wherein the side of the first bending portion away from the heat dissipation layer main body and the side of the second bending portion away from the heat dissipation layer main body each have an arc-shaped transition with the arc-shaped side of the corner bending portion away from the heat dissipation layer main body.

10. The heat dissipation assembly according to claim 1, wherein a second opening includes a second main body portion and two second end portions respectively disposed at two ends of the second main body portion; the second main body portion is in a shape of a strip, and extends in an extending direction of a side, connected to the first bending portion or the second bending portion where the second opening is located, of the heat dissipation layer main body;

in a length extending direction of the second main body portion, widths of the second main body portion at multiple positions are substantially equal; or in the length extending direction of the second main body portion, the width of the second main body portion is gradually decreased and then gradually increased from a second end portion of the two second end portions of the second opening to another second end portion of the two second end portions.

11. The heat dissipation assembly according to claim 1, wherein the corner bending portion is provided with the plurality of first openings therein, and the first bending portion and/or the second bending portion is provided with a plurality of second openings therein, a transition region is provided between a region where the plurality of first openings are located and a region where the plurality of second openings are located; a width of the transition region is approximately in a range of 1 mm to 2.5 mm, inclusive; the transition region is provided with no opening.

12. The heat dissipation assembly according to claim 11, further comprising:

a transition portion arranged in the transition region, the transition portion is connected to the first bending portion and the second bending portion; wherein the transition portion includes an arc-shaped transition side, and the arc-shaped transition side is curved toward a direction in which the transition portion is away from the heat dissipation layer main body portion; a side of the first bending portion away from the heat dissipation layer main body and a side of the second bending portion away from the heat dissipation layer main body are each connected to an arc-shaped side of the corner bending portion away from the heat dissipation layer main body by the arc-shaped transition side.

13. The heat dissipation assembly according to claim 11, wherein second openings, located at a position proximate to a border of the transition region, are aligned.

14. The heat dissipation assembly according to claim 1, wherein the heat dissipation layer main body includes two first sides disposed opposite to each other, four arc-shaped corner sides, and two second sides disposed opposite to each other; a single arc-shaped corner side is connected between any adjacent first side and second side;

the heat dissipation assembly comprises first bending portions, second bending portions and corner bending portions; wherein each first side is connected to a single first bending portion, each second side is connected to a single second bending portion, and each arc-shaped corner side is connected to a single corner bending portion; each corner bending portion is provided with the at least one first opening.

15. The heat dissipation assembly according to claim 1, comprising:

a heat dissipation layer, wherein the heat dissipation layer main body, the at least one first bending portion, the at least one second bending portion and the at least one corner bending portion are located in the heat dissipation layer;

an adhesive layer arranged on a side of the heat dissipation layer; and a buffer layer arranged between the adhesive layer and the heat dissipation layer.

16. The heat dissipation assembly according to claim 15, wherein a thickness of the heat dissipation layer is greater than or equal to 100 μm; and/or the heat dissipation layer includes a copper plate, an aluminum alloy plate, or a stainless steel plate.

17. A display module, comprising:

a display panel including a light exit surface and a backlight surface, wherein edges at sides and edges at corners of the display panel are bent toward the backlight surface; and the heat dissipation assembly according to claim 1, wherein the heat dissipation assembly is disposed on the backlight surface of the display panel, and the at least one first bending portion, the at least one second bending portion and the at least one corner bending portion of the heat dissipation assembly are curved toward a direction away from the display panel.

18. A display device, comprising the heat dissipation assembly according to claim 1.

* * * * *